US012717033B2

(12) United States Patent
Yasu et al.

(10) Patent No.: US 12,717,033 B2
(45) Date of Patent: Aug. 25, 2026

(54) RANGING DEVICE

(71) Applicant: SONY SEMICONDUCTOR SOLUTIONS CORPORATION, Kanagawa (JP)

(72) Inventors: Yohtaro Yasu, Kanagawa (JP); Yoshiki Ebiko, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 958 days.

(21) Appl. No.: 17/998,551

(22) PCT Filed: Mar. 30, 2021

(86) PCT No.: PCT/JP2021/013695

§ 371 (c)(1),
(2) Date: Nov. 11, 2022

(87) PCT Pub. No.: WO2021/240988

PCT Pub. Date: Dec. 2, 2021

(65) Prior Publication Data

US 2023/0204773 A1 Jun. 29, 2023

(30) Foreign Application Priority Data

May 26, 2020 (JP) ................................ 2020-091569

(51) Int. Cl.
*G01S 17/48* (2006.01)
*H10F 39/10* (2025.01)

(52) U.S. Cl.
CPC ............ *G01S 17/48* (2013.01); *H10F 39/103* (2025.01); *H10F 39/107* (2025.01)

(58) Field of Classification Search
None
See application file for complete search history.

(56) References Cited

U.S. PATENT DOCUMENTS

2016/0049449 A1 2/2016 Kim
2016/0064435 A1 3/2016 Yabuki
(Continued)

FOREIGN PATENT DOCUMENTS

CN 105185800 A 12/2015
CN 105321968 A 2/2016
(Continued)

OTHER PUBLICATIONS

International Search Report and Written Opinion prepared by the Japan Patent Office on Jun. 28, 2021, for International Application No. PCT/JP2021/013695, 3 pgs.

*Primary Examiner* — Luke D Ratcliffe
(74) *Attorney, Agent, or Firm* — SHERIDAN ROSS P.C.

(57) ABSTRACT

To provide a ranging device having improved quantum efficiency and resolution. The present disclosure provides a ranging device including: a semiconductor layer having a first surface and a second surface opposite to the first surface; a lens on the second surface side; first and second charge storage sections in the semiconductor layer on the first surface side; a photoelectric conversion section that is in contact with the semiconductor layer on the first surface side, the photoelectric conversion section including a material different from a material of the semiconductor layer; first and second voltage application sections that apply a voltage to the semiconductor layer between the first and second charge storage sections and the photoelectric conversion section; and a waveguide provided in the semiconductor layer so as to extend from the second surface to the photoelectric conversion section, the waveguide including a material different from the material of the semiconductor layer.

20 Claims, 19 Drawing Sheets

(56) References Cited

U.S. PATENT DOCUMENTS

| | | | | |
|---|---|---|---|---|
| 2018/0188356 | A1 | 7/2018 | Na et al. | |
| 2018/0190698 | A1* | 7/2018 | Na | H10D 62/117 |
| 2019/0068903 | A1* | 2/2019 | Shimotsusa | H10F 39/803 |

FOREIGN PATENT DOCUMENTS

| | | | |
|---|---|---|---|
| CN | 110663114 | | 1/2020 |
| CN | 110710196 | | 1/2020 |
| EP | 3607738 | | 2/2020 |
| EP | 3610510 | | 2/2020 |
| JP | 2006-246450 | | 9/2006 |
| JP | 2006-339339 | | 12/2006 |
| JP | 2007095792 | A | 4/2007 |
| JP | 2013-157442 | | 8/2013 |
| JP | 2015228468 | A | 12/2015 |
| JP | 2020-009883 | | 1/2020 |
| JP | 2020-013909 | | 1/2020 |
| JP | 2020-516200 | | 5/2020 |
| JP | 2020-517114 | | 6/2020 |
| KR | 10-2011-0079329 | | 7/2011 |
| KR | 20160021611 | A | 2/2016 |
| TW | 201904034 | | 1/2019 |
| TW | 201904085 | | 1/2019 |
| TW | 202011616 | | 3/2020 |
| WO | WO-2018160721 | A1 | 9/2018 |
| WO | WO 2018/187370 | | 10/2018 |
| WO | WO 2018/191539 | | 10/2018 |
| WO | WO 2020/008907 | | 1/2020 |

* cited by examiner

10
OP
47
46
43
F2
45
61
61
θt
55
52
51
FD1
FD2
F1
TRG1 g
TRG2 g
TRG1
TRG2
PD
V11
V12
62
M11
M12
V21
V21
M21
M22
V31
V31
M31
M32
V41
V42
FDL1,FDL2
M41
M42
20

601
602
RANGING MODULE
603
IMAGING DEVICE
604
DISPLAY
605
SPEAKER
606
MICROPHONE
607
COMMUNICATION MODULE
608
SENSOR UNIT
609
TOUCH PANEL
610
CONTROL UNIT
621
APPLICATION PROCESSOR
622
OPERATION SYSTEM PROCESSOR
601
602
605
603
604
606

RANGING DEVICE

CROSS REFERENCE TO RELATED APPLICATIONS

This application is a national stage application under 35 U.S.C. 371 and claims the benefit of PCT Application No. PCT/JP2021/013695, having an international filing date of 30 Mar. 2021, which designated the United States, which PCT application claimed the benefit of Japanese Patent Application No. 2020-091569, filed 26 May 2020, the entire disclosures of each of which are incorporated herein by reference.

TECHNICAL FIELD

The present disclosure relates to a ranging device.

BACKGROUND ART

A ranging device using an indirect time of flight (iToF) method has been developed. The ranging device using the indirect ToF indirectly calculates the distance from the ranging device to an object on the basis of a phase difference between irradiation light and reflected light.

CITATION LIST

Patent Document

Patent Document 1: Japanese Patent Application Laid-Open No. 2020-013909

SUMMARY OF THE INVENTION

Problems to be Solved by the Invention

However, the conventional ranging device using the indirect ToF method has a photodiode in a silicon substrate, and cannot obtain sufficient quantum efficiency Qe (sensitivity). In addition, the ranging device using a silicon substrate having high infrared transmittance needs to increase the thickness of the silicon substrate in order to increase quantum efficiency. However, when the thickness of the silicon substrate is increased, separation between adjacent pixels electrically or optically is difficult, entailing a problem of reduction in resolution due to deterioration in a signal-to-noise ratio (SNR).

Therefore, the present disclosure has been made in view of such a problem, and provides a ranging device capable of improving quantum efficiency and resolution.

Solutions to Problems

A ranging device according to one aspect of the present disclosure including: a semiconductor layer having a first surface and a second surface opposite to the first surface; a lens provided on a side of the second surface; first and second charge storage sections provided in the semiconductor layer on a side of the first surface; a photoelectric conversion section that is in contact with the semiconductor layer on the side of the first surface, the photoelectric conversion section including a material different from a material of the semiconductor layer; first and second voltage application sections that apply a voltage to the semiconductor layer between the first and second charge storage sections and the photoelectric conversion section; and a waveguide provided in the semiconductor layer so as to extend from the second surface to the photoelectric conversion section, the waveguide including a material different from the material of the semiconductor layer.

An area of an end surface of the waveguide on the side of the first surface may be smaller than an area of an end surface of the waveguide on the side of the second surface.

The waveguide may have an area equal to or larger than an area of an opening through which incident light passes from the lens to the semiconductor layer at an end surface on the side of the second surface, have an area equal to or smaller than an area of the photoelectric conversion section at an end surface on the side of the first surface, and have a side surface inclined in a direction perpendicular to the first surface or the second surface between the first surface and the second surface.

The refractive index of the waveguide may be higher than the refractive index of the semiconductor layer.

The refractive index of the waveguide may be lower than the refractive index of the lens.

The ranging device may further include a metal layer provided on the side surface of the waveguide.

Silicon may be used for the semiconductor layer, germanium, InGaAs, copper indium gallium diselenide (CIGS), or quantum dot (Qdot) may be used for the photoelectric conversion section, and a resin material may be used for the waveguide.

The ranging device may further include a mixture layer provided between the photoelectric conversion section and the semiconductor layer, the mixture layer being obtained by mixing a material of the photoelectric conversion section and a material of the semiconductor layer.

The ranging device may further include an additional waveguide provided on the waveguide on the side of the second surface, in which an area of a first end surface of the waveguide on the side of the first surface may be greater than an area of a second end surface of the waveguide on the side of the second surface, and an area of a third end surface of the additional waveguide facing the second end surface of the waveguide may be smaller than an area of a fourth end surface of the additional waveguide on a side opposite to the third end surface.

The first voltage application section may include a first gate electrode that is provided on the first surface between the first charge storage section and the photoelectric conversion section and that is insulated from the semiconductor layer, the second voltage application section may include a second gate electrode that is provided on the first surface between the second charge storage section and the photoelectric conversion section and that is insulated from the semiconductor layer, and the ranging device may further include: a second wire provided on the side of the first surface and connected to the first voltage application section; and a third wire provided on the side of the first surface and connected to the second voltage application section.

The first and second voltage application sections may be provided on the first surface of the semiconductor layer with an insulating film interposed therebetween.

The first and second voltage application sections may be embedded in the semiconductor layer from the first surface of the semiconductor layer.

The first voltage application section may include a first impurity layer adjacent to the first charge storage section on the first surface and having a conductivity type different from a conductivity type of the first charge storage section, the second voltage application section may include a second impurity layer adjacent to the second charge storage section on the first surface and having a conductivity type different from a conductivity type of the second charge storage section, and the ranging device may further include: a second wire provided on the side of the first surface and connected to the first voltage application section; and a third wire provided on the side of the first surface and connected to the second voltage application section.

The photoelectric conversion section may be smaller than an opening through which incident light passes from the lens to the semiconductor layer when viewed from above the second surface of the semiconductor layer.

The ranging device may further include a metal layer including a conductive material that reflects light, the metal layer covering a periphery of the photoelectric conversion section except for a contact portion between the photoelectric conversion section and the semiconductor layer.

MODE FOR CARRYING OUT THE INVENTION

Figure 1:
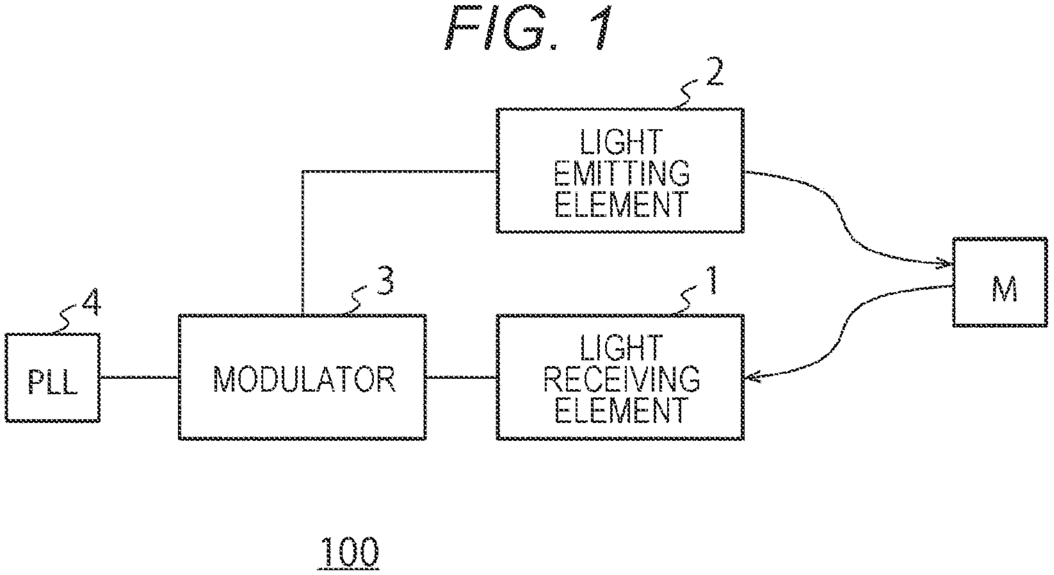
FIG. 1 is a block diagram depicting a configuration example of a ranging device according to a first embodiment.

Specific embodiments to which the present technology is applied will be described below in detail with reference to the drawings. The drawings are schematic or conceptual, and the ratios and the like of respective components are not necessarily the same as actual ones. In the specification and the drawings, elements similar to the elements previously described with reference to previously described drawings are denoted by the same reference numerals, and the detailed description thereof will be omitted as appropriate.

First Embodiment

FIG. 1 is a block diagram depicting a configuration example of a ranging device according to the first embodiment. A ranging device 100 uses an indirect ToF (hereinafter, also referred to as iToF) method, and is used, for example, in an in-vehicle system or the like that is mounted on a vehicle and measures a distance to an object outside the vehicle. Furthermore, the ranging device 100 may also be used in, for example, a system that identifies an individual, such as face authentication.

The ranging device 100 includes a light receiving element 1, a light emitting element 2, a modulator 3, and a phase locked loop (PLL) 4. The PLL 4 generates a pulse signal. The modulator 3 modulates the pulse signal from the PLL 4 and generates a control signal. The frequency of the control signal may be, for example, 5 MHz to 20 MHz. The light emitting element 2 emits light in accordance with the control signal from the modulator. The light emitting element 2 includes, as a light source, a light emitting diode that emits infrared light having a wavelength in a range of 780 nm to 1000 nm, and generates irradiation light in synchronization with the control signal having a rectangular wave or a sine wave. The light generated by the light emitting element 2 may be, for example, short wave infrared radiometer light (SWIR), or the like. The irradiation light emitted from the light emitting element 2 is reflected by an object M and received by the light receiving element 1.

The reflected light received by the light receiving element 1 is delayed from the timing at which the light emitting element 2 emits light depending on the distance to the object M. A delay time of the reflected light with respect to the irradiation light causes a phase difference between the irradiation light and the reflected light. In the iToF method, the ranging device 100 calculates a phase difference between the irradiation light and the reflected light, and obtains a distance (depth information) from the ranging device 100 to the object M on the basis of the phase difference.

Figure 2:
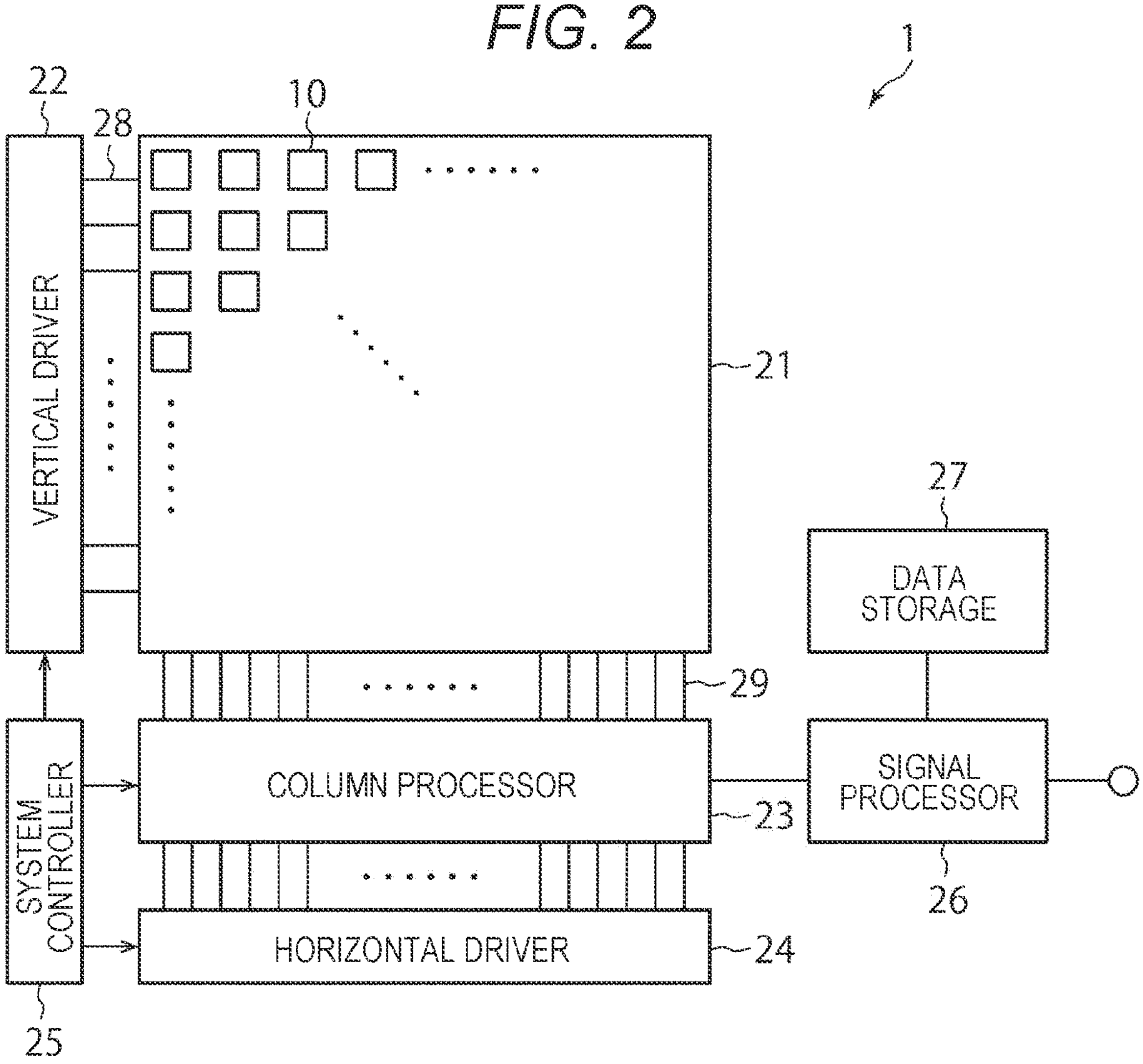
FIG. 2 is a block diagram depicting a schematic configuration example of a light receiving element of the ranging device according to the first embodiment.

FIG. 2 is a block diagram depicting a schematic configuration example of the light receiving element of the ranging device according to the first embodiment. The light receiving element 1 is an element used in the iToFF ranging device 100 in FIG. 1.

The light receiving element 1 receives light (reflected light) returned after irradiation light generated by the light emitting element 2 as a light source strikes the object and is reflected, and outputs a depth image representing distance information to the object as a depth value.

The light receiving element 1 includes a pixel array unit 21 provided on a semiconductor substrate (not illustrated) and a peripheral circuit unit provided on the same semiconductor substrate. The peripheral circuit unit includes, for example, a vertical driver 22, a column processor 23, a horizontal driver 24, a system controller 25, a signal processor 26, a data storage 27, and the like. Note that all or part of the peripheral circuit unit may be provided on the same semiconductor substrate as the light receiving element 1, or may be provided on a substrate different from the substrate of the light receiving element 1.

The pixel array unit 21 includes a plurality of pixels 10 two-dimensionally arranged in a matrix in a row direction and a column direction. The pixels 10 generate charges corresponding to an amount of received light, and output signals corresponding to the generated charges. That is, the pixels 10 photoelectrically convert the incident light and output signals corresponding to charges obtained as a result of the photoelectric conversion. The details of the pixels 10 will be described later. Note that, in FIG. 2, the row direction is the horizontal direction, and the column direction is the vertical direction.

In the pixel array unit 21, with respect to the pixel array matrix, a pixel drive line 28 extends along the row direction for each pixel row, and two vertical signal lines 29 extend along the column direction for each pixel column. For example, the pixel drive line 28 transmits a drive signal for performing driving to read signals from the pixels 10. Note that, although FIG. 2 indicates the pixel drive line 28 as one wiring line, the pixel drive line 28 is not limited to be constituted by one wiring line. One ends of the pixel drive lines 28 are connected to output ends of the vertical driver 22 corresponding to the respective rows.

The vertical driver 22 includes a shift register, an address decoder, and the like, and drives all the pixels 10 in the pixel array unit 21 simultaneously or drives the pixels 10 in the pixel array unit 21 on, for example, a row-by-row basis. That is, the vertical driver 22 constitutes a driver that controls the operation of each pixel 10 of the pixel array unit 21 together with the system controller 25 that controls the vertical driver 22.

A detection signal output from each pixel 10 of the pixel row in accordance with the drive control by the vertical driver 22 is input to the column processor 23 through the vertical signal line 29. The column processor 23 performs predetermined signal processing on the detection signal output from each pixel 10 through the vertical signal line 29, and temporarily holds the detection signal which has been subjected to the signal processing. Specifically, the column processor 23 performs noise removal processing, analog-to-digital (AD) conversion processing, and the like as signal processing.

The horizontal driver 24 includes a shift register, an address decoder, and the like, and selects one by one a unit circuit corresponding to each column of pixels in the column processor 23. Due to the selective scanning by the horizontal driver 24, the detection signals subjected to the signal processing for each unit circuit in the column processor 23 are sequentially output.

The system controller 25 includes a timing generator that generates various types of timing signals, and the like, and controls drives of the vertical driver 22, the column processor 23, the horizontal driver 24, and the like on the basis of various types of timing signals generated by the timing generator.

The signal processor 26 has an arithmetic processing function, and performs various kinds of signal processing such as arithmetic processing on the basis of the detection signals output from the column processor 23. The data storage 27 temporarily stores data necessary for signal processing in the signal processor 26.

The light receiving element 1 configured as described above adds the distance information regarding the distance to the object to a pixel value as the depth value, and outputs the pixel value as the depth image. The light receiving element 1 can be mounted on, for example, a vehicle-mounted system or the like that is mounted on a vehicle and measures a distance to an object outside the vehicle.

Figure 3:
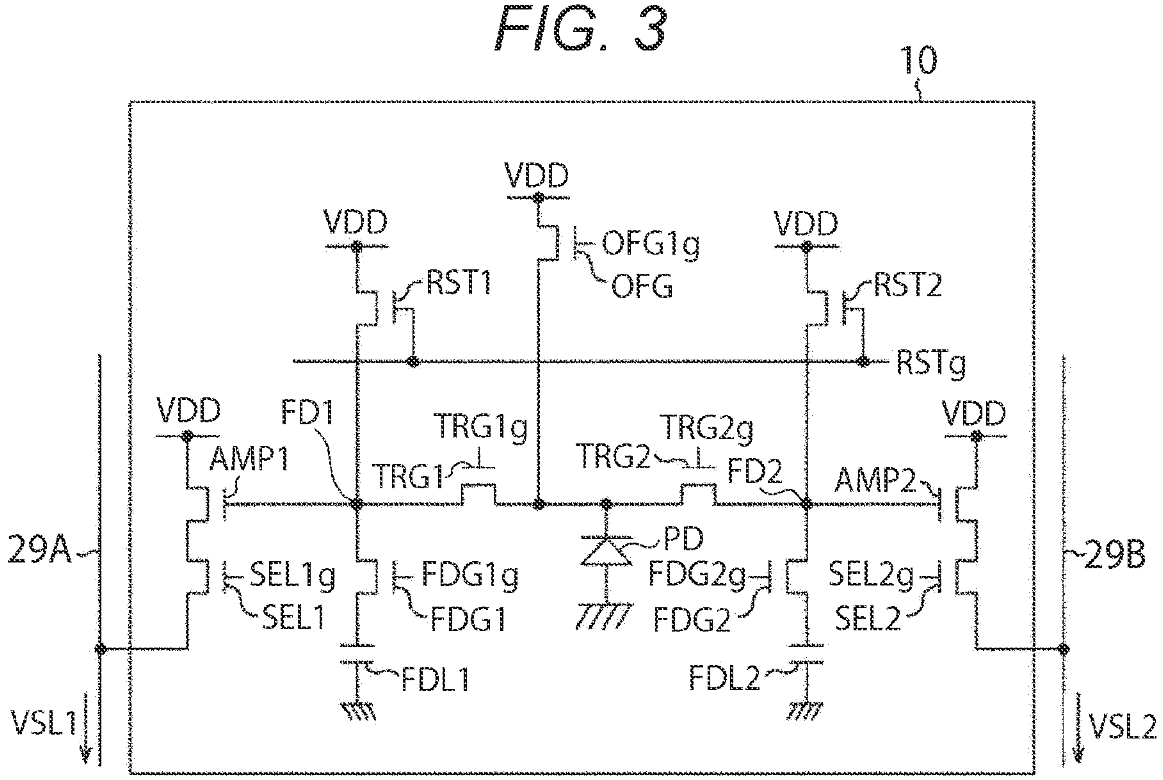
FIG. 3 is a diagram depicting an example of a circuit configuration of a pixel.

FIG. 3 is a diagram depicting an example of a circuit configuration of each of the pixels 10. The pixel 10 includes a photodiode PD, transfer transistors TRG1 and TRG2, floating diffusion regions FD1 and FD2, additional capacitors FDL1 and FDL2, switching transistors FDG1 and FDG2, amplification transistors AMP1 and AMP2, reset transistors RST1 and RST2, selection transistors SEL1 and SEL2, and a charge discharge transistor OFG.

The photodiode PD is a photoelectric conversion element that generates a charge in response to received light.

The transfer transistors TRG1 and TRG2, the switching transistors FDG1 and FDG2, the amplification transistors AMP1 and AMP2, the selection transistors SEL1 and SEL2, the reset transistors RST1 and RST2, and the charge discharge transistor OFG are configured by, for example, N-type metal oxide semiconductor field effect transistors (MOSFETs).

The transfer transistor TRG1 is conductive when a transfer signal applied to a gate electrode TRG1*g* is active (for example, at high level), and transfers charges accumulated in the photodiode PD to the floating diffusion region FD1. The transfer transistor TRG2 is conductive when a transfer signal applied to a gate electrode TRG2*g* is active, and transfers charges accumulated in the photodiode PD to the floating diffusion region FD2.

The floating diffusion regions FD1 and FD2 are charge storage sections capable of storing the charges transferred from the photodiode PD.

The switching transistor FDG1 is conductive when a switching signal FDG1*g* is active, and connects the additional capacitor FDL1 to the floating diffusion region FD1. The switching transistor FDG2 is conductive when a switching signal FDG2*g* is active, and connects the additional capacitor FDL2 to the floating diffusion region FD2. The additional capacitors FDL1 and FDL2 are only required to be constituted by, for example, a capacitive element such as a metal-on-metal (MoM) capacitor, a metal-insulator-metal (MIM) capacitor, or a MOS capacitor. Note that the switching transistors FDG1 and FDG2 are in a conductive state when accumulating charges due to incident light in the iToF, and are electrically connected to the floating diffusion regions FD1 and FD2, respectively. Thus, the pixel 10 can suppress saturation of signal charges in the floating diffusion regions FD1 and FD2, and can accumulate charges.

The reset transistor RST1 is conductive when a reset drive signal RSTg is active, and resets the potential of the floating diffusion region FD1. The reset transistor RST2 is conductive when the reset drive signal RSTg is active, and resets the potential of the floating diffusion region FD2. Note that, when the reset transistors RST1 and RST2 are activated, the switching transistors FDG1 and FDG2 are also activated simultaneously, and the additional capacitors FDL1 and FDL2 are also reset.

For example, in a case where charges due to incident light are accumulated in iToF, the vertical driver 22 brings the switching transistors FDG1 and FDG2 into a conductive state to connect the floating diffusion region FD1 and the additional capacitor FDL1 and connect the floating diffusion region FD2 and the additional capacitor FDL2. Thus, a large amount of charge can be accumulated.

On the other hand, in a case of increasing the quantum efficiency, the vertical driver 22 may bring the switching transistors FDG1 and FDG2 into a non-conductive state to separate the additional capacitors FDL1 and FDL2 from the floating diffusion regions FD1 and FD2, respectively. By switching the switching transistors FDG1 and FDG2 in this manner, the dynamic range of the light receiving element 1 can be increased.

The charge discharge transistor OFG is conductive when a discharge signal OFG1*g* is active, and discharges the charges accumulated in the photodiode PD. The charge discharge transistor OFG is used in a case where the charges in the photodiode PD overflow due to strong incident light.

A source electrode of the amplification transistor AMP1 is connected to a vertical signal line 29A via the selection transistor SEL1. Thus, the amplification transistor AMP1 is connected to a constant-current source (not illustrated) to constitute a source follower circuit. A source electrode of the amplification transistor AMP2 is connected to a vertical signal line 29B via the selection transistor SEL2. Thus, the amplification transistor AMP2 is connected to the constant-current source (not illustrated) to constitute a source follower circuit.

The selection transistor SEL1 is connected between the source electrode of the amplification transistor AMP1 and the vertical signal line 29A. The selection transistor SEL1 is conductive when the selection signal SELlg is active, and outputs a detection signal VSL1 output from the amplification transistor AMP1 to the vertical signal line 29A.

The selection transistor SEL2 is connected between the source electrode of the amplification transistor AMP2 and the vertical signal line 29B. The selection transistor SEL2 is conductive when the selection signal SEL2*g* is active, and outputs a detection signal VSL2 output from the amplification transistor AMP2 to the vertical signal line 29B.

The transfer transistors TRG1 and TRG2, the switching transistors FDG1 and FDG2, the amplification transistors AMP1 and AMP2, the selection transistors SEL1 and SEL2, and the charge discharge transistor OFG of the pixel 10 are controlled by the vertical driver 22.

Note that, in a case where charges due to incident light are accumulated in the iToF, the additional capacitors FDL1 and FDL2 are respectively connected to the floating diffusion regions FD1 and FD2 as described above. Therefore, the pixel 10 of iToF may not include the switching transistors FDG1 and FDG2.

Next, the operation of the pixel 10 will be briefly described.

First, before light reception is started, a reset operation for resetting charges in the pixels 10 is performed in all the pixels. That is, the charge discharge transistor OFG, the reset transistors RST1 and RST2, and the switching transistors FDG1 and FDG2 are brought into a conductive state to discharge charges accumulated in the photodiode PD, the floating diffusion regions FD1 and FD2, and the additional capacitors FDL1 and FDL2.

After the discharge of accumulated charges, light reception is started.

In a light receiving period, the transfer transistors TRG1 and TRG2 are alternately driven. For example, in a first period, the transfer transistor TRG1 is in a conductive state (ON), and the transfer transistor TRG2 is in a non-conductive state (OFF). At this time, the charges generated in the photodiode PD are transferred to the floating diffusion region FD1 and the additional capacitor FDL1. In a second period next to the first period, the transfer transistor TRG1 is turned off, and the transfer transistor TRG2 is turned on. In the second period, the charges generated in the photodiode PD are transferred to the floating diffusion region FD2 and the additional capacitor FDL2. As a result, the charges generated in the photodiode PD are distributed and accumulated in the floating diffusion regions FD1 and FD2.

The first and second periods are periodically and alternately repeated in synchronization with the irradiation light from the light emitting element 2. As a result, the floating diffusion regions FD1 and FD2 and the additional capacitors FDL1 and FDL2 can accumulate charges according to the phase difference between the irradiation light from the light emitting element 2 and the reflected light received by the light receiving element 1. The relationship between the phase difference and the charges accumulated in the floating diffusion regions FD1 and FD2 and the additional capacitors FDL1 and FDL2 will be described later.

Then, when the light receiving period ends, each pixel 10 of the pixel array unit 21 is sequentially selected. In the selected pixel 10, the selection transistors SEL1 and SEL2 are turned on. As a result, the charges accumulated in the floating diffusion region FD1 and the additional capacitor FDL1 are output to the column processor 23 via the vertical signal line 29A as the detection signal VSL1. The charges accumulated in the floating diffusion region FD2 and the additional capacitor FDL2 are output to the column processor 23 via the vertical signal line 29B as the detection signal VSL2.

When one light receiving operation ends in this manner, the next light receiving operation starting from the reset operation is executed.

The reflected light received by the pixel 10 is delayed from the timing at which the light source emits light according to the distance to the object. A phase difference occurs between the irradiation light and the reflected light by the delay time according to the distance to the object, and the distribution ratio of the charges accumulated in the additional capacitors FDL1 and FDL2 (or the floating diffusion regions FD1 and FD2) changes. Therefore, the phase difference between the irradiation light and the reflected light is calculated by detecting the potentials of the floating diffusion regions FD1 and FD2, and the distance to the object can be obtained on the basis of the phase difference.

Figure 4:
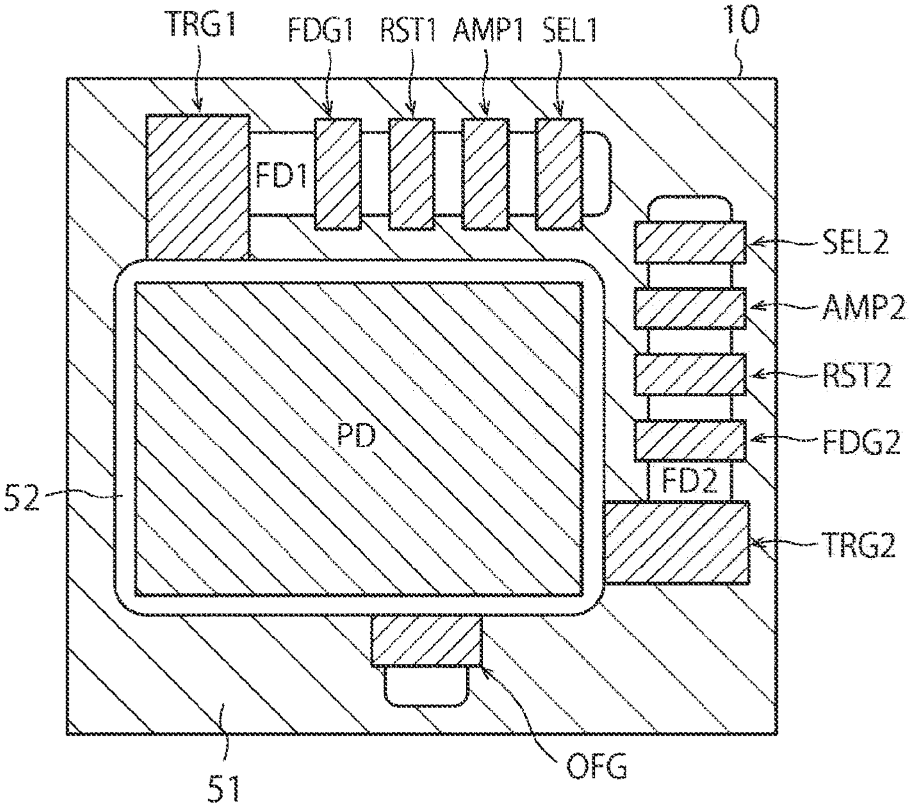
FIG. 4 is a plan view depicting an arrangement example of the pixel circuit illustrated in FIG. 3.

FIG. 4 is a plan view depicting an arrangement example of the pixel circuit depicted in FIG. 3. The horizontal direction in FIG. 4 corresponds to the row direction (horizontal direction) in FIG. 2, and the vertical direction corresponds to the column direction (vertical direction) in FIG. 2.

As depicted in FIG. 4, an N+ type impurity layer 52 is provided in an N-type semiconductor layer 51. The photodiode PD is provided in the impurity layer 52. When viewed from above the surface of the semiconductor layer 51, the impurity layer 52 and the photodiode PD have a substantially rectangular outer shape, and the photodiode PD is provided inside the impurity layer 52. Note that the size of the planar layout of the photodiode PD is not particularly limited. A waveguide 55 guides most of incident light, so that the size of the planar layout of the photodiode PD is only required to be substantially equal to or larger than the end surface of the waveguide 55 on the front surface F1 side. With this configuration, the photodiode PD can sufficiently receive the incident light guided by the waveguide 55, and the quantum efficiency can also be improved.

The transfer transistor TRG1, the switching transistor FDG1, the reset transistor RST1, the amplification transistor AMP1, and the selection transistor SEL1 are linearly arranged along a predetermined one of the four sides of the rectangular pixel 10 outside the impurity layer 52. In addition, the transfer transistor TRG2, the switching transistor FDG2, the reset transistor RST2, the amplification transistor AMP2, and the selection transistor SEL2 are linearly arranged along another side of the four sides of the rectangular pixel 10. Furthermore, the charge discharge transistor OFG is disposed on a side different from the two sides of the pixel 10 in which the transfer transistors TRG1, TRG2, and the like are provided. For example, the charge discharge transistor OFG is disposed on a side facing the side of the pixel 10 where the transfer transistor TRG1, FDG1, RST1, AMP1, and SEL1 are provided. Note that the arrangement of the pixel circuit depicted in FIG. 4 is not limited to this example, and other arrangements may be employed.

Figure 5:
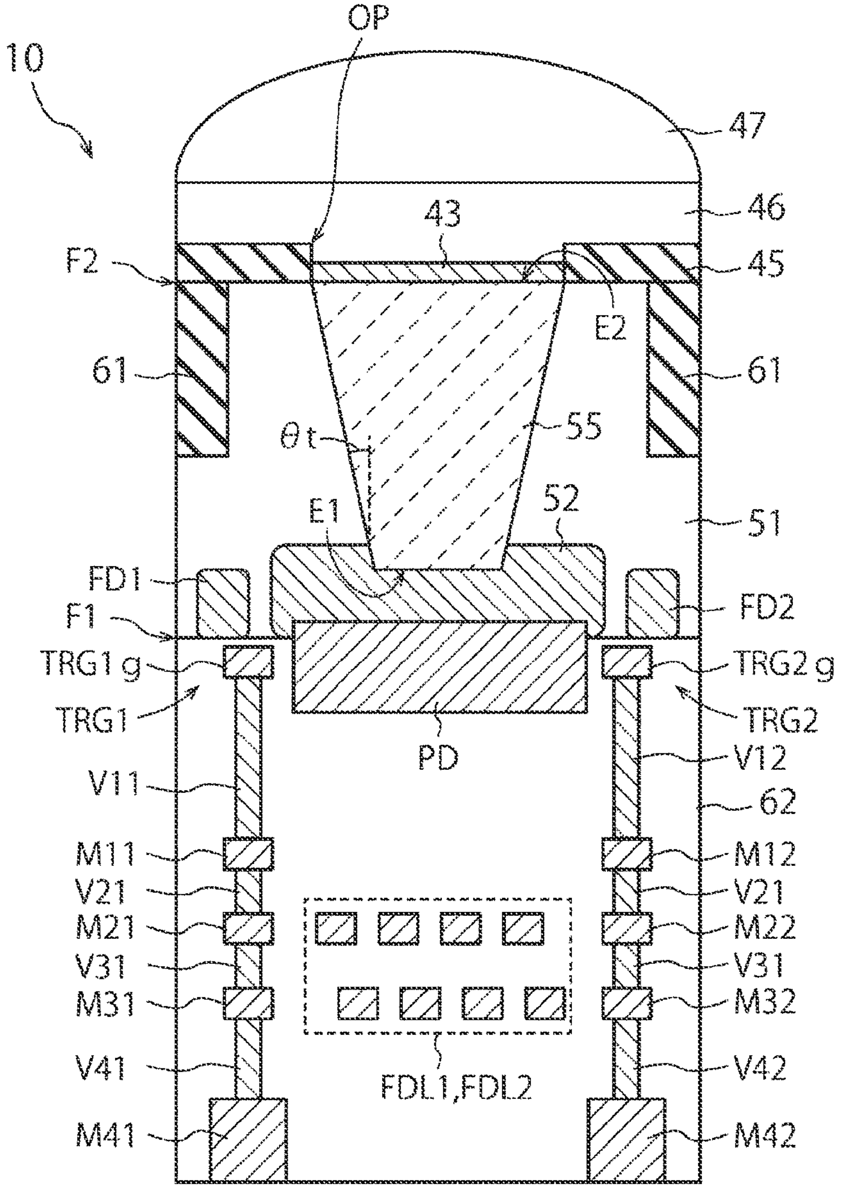
FIG. 5 is a cross-sectional view depicting a configuration example of the pixel according to the first embodiment.

FIG. 5 is a cross-sectional view depicting a configuration example of the pixel 10 according to the first embodiment. Although FIG. 5 illustrates only one pixel 10, a plurality of pixels 10 is two-dimensionally arranged in parallel in the pixel array unit 21.

The pixel 10 includes a semiconductor layer 51, an on-chip lens 47, an antireflection film 43, a light shielding film 45, an inter-pixel isolation section 61, the impurity layer 52, the waveguide 55, the floating diffusion regions FD1 and FD2, the photodiode PD, the transfer transistors TRG1 and TRG2, vias V1 to V4 and Vbias, wires M1 to M4 and Mbias, and the additional capacitors FDL1 and FDL2.

The semiconductor layer 51 includes, for example, silicon, and has a thickness of, for example, 1 μm to 6 μm. The semiconductor layer 51 is, for example, an N-type semiconductor layer. The semiconductor layer 51 has a front surface F1 as a first surface and a back surface F2 as a second surface reverse to the front surface F1. A multilayer wiring structure including the wires M1 to M4 and Mbias is provided on the front surface F1 side. The on-chip lens 47 for receiving light is provided on the back surface F2 side. Therefore, the light receiving element 1 according to the present disclosure is a back-illuminated element, and receives light on the back surface F2 opposite to the front surface F1 on which the wires M1 to M4 and Mbias are provided. The back surface F2 of the semiconductor layer 51 is a light entrance surface.

The antireflection film 43 is provided on the back surface F2 of the semiconductor layer 51. The antireflection film 43 may have a laminated structure in which a fixed charge film and an oxide film are laminated. For example, the antireflection film 43 may be a high dielectric constant (High-k) insulating film by an atomic layer deposition (ALD) method. More specifically, for example, a metal oxide film such as hafnium oxide (HfO2), aluminum oxide (Al2O3), titanium oxide (TiO2), tantalum oxide ($Ta_2O_5$), or strontium titan oxide (STO) can be used for the antireflection film 43.

The light shielding film 45 is provided in a region other than the antireflection film 43 on the back surface F2 of the semiconductor layer 51. The light shielding film 45 is provided adjacent to the periphery of the antireflection film 43, and prevents entry of incident light from a region other than the antireflection film 43. That is, the light shielding film 45 defines an opening OP through which incident light passes from the on-chip lens 47 to the semiconductor layer 51. The light shielding film 45 includes a light shielding material. For example, the light shielding film 45 may include a metal material such as tungsten (W), aluminum (Al), or copper (Cu).

The inter-pixel isolation section 61 is provided at a boundary portion between the plurality of adjacent pixels 10 in the semiconductor layer 51, and isolates the plurality of adjacent pixels 10 from each other. The inter-pixel isolation section 61 prevents leakage of incident light to the adjacent pixel (that is, crosstalk). The inter-pixel isolation section 61 also includes a light shielding material. For example, the inter-pixel isolation section 61 may include a metal material such as tungsten (W), aluminum (Al), or copper (Cu). Note that, although not illustrated, the bottom surface and the side surface of the inter-pixel isolation section 61 may be covered with a material that reflects light. With this configuration, an amount of light incident on the photodiode PD increases, and the quantum efficiency of the pixel 10 is improved.

A planarization film 46 is provided on the antireflection film 43 and the light shielding film 45. For the planarization film 46, an insulating film such as silicon oxide (SiO2), silicon nitride (SiN), or silicon oxynitride (SiON), or an organic material such as resin is used, for example.

On the planarization film 46, the on-chip lens 47 is provided for each pixel 10. The on-chip lens 47 is provided on the back surface F2 of the semiconductor layer 51. For the on-chip lens 47, a resin material such as a styrene resin, an acrylic resin, a styrene-acrylic copolymer resin, or a siloxane resin is used, for example. Light condensed by the on-chip lens 47 is incident on the photodiode PD via the antireflection film 43 and the semiconductor layer 51.

On the other hand, on the front surface F1 side of the semiconductor layer 51, the photodiode PD is provided as an example of a photoelectric conversion section. The photodiode PD is provided on the front surface F1 of the semiconductor layer 51 so as to be in contact with the semiconductor layer 51, and includes a material different from that of the semiconductor layer 51. A material having higher quantum efficiency (photoelectric conversion efficiency) than silicon is used for the photodiode PD, and germanium, InGaAs, copper indium gallium diselenide (CIGS), or quantum dot (Qdot) is used, for example. The photodiode PD generates a charge corresponding to an amount of received light. Further, the photodiode PD somewhat protrudes into the semiconductor layer 51 or the impurity layer 52 from the front surface F1 toward the back surface F2. As a result, the path from the photodiode PD to the floating diffusion regions FD1 and FD2 via the transfer transistors TRG1 and TRG2 is decreased, and the charge transfer efficiency and the transfer rate are improved.

The photodiode PD is connected to the wire Mbias via the via Vbias as a first wire. The wire Mbias is provided on the front surface F1 side, and is electrically connected to the photodiode PD in order to apply a predetermined bias voltage to the photodiode PD. For example, by applying a positive voltage (for example, about +0.5 V) to the wire Mbias, charges (for example, electrons) photoelectrically converted by the photodiode PD are easily taken into the impurity layer 52.

The impurity layer 52 is provided in the semiconductor layer 51 on the front surface F1 side and is in contact with the photodiode PD. The impurity layer 52 is, for example, an N-type impurity layer higher in impurity concentration than the semiconductor layer 51, and takes charges photoelectrically converted by the photodiode PD therein.

The floating diffusion regions FD1 and FD2 are provided on each side of the impurity layer 52 as an example of first and second charge storage sections. The floating diffusion regions FD1 and FD2 are provided in the semiconductor layer 51 on the front surface F1 side, and temporarily hold or accumulate charges transferred from the photodiode PD. The floating diffusion regions FD1 and FD2 are, for example, N-type impurity layers and contain high-concentration impurities having an impurity concentration higher than that of the semiconductor layer 51.

The gate electrode TRG1*g* of the transfer transistor TRG1 is provided on the front surface F1 between the floating diffusion region FD1 and the photodiode PD or the impurity layer 52 as an example of a first voltage application section. The gate electrode TRG1*g* is provided on the front surface F1 with a gate insulating film therebetween, and is electrically insulated from the semiconductor layer 51. The gate electrode TRG1*g* can apply a voltage to the semiconductor layer 51 between the floating diffusion region FD1 and the photodiode PD or the impurity layer 52 to bring the transfer transistor TRG1 into a conductive state or a non-conductive state. For the gate electrode TRG1*g*, a conductive material such as metal or polysilicon doped with impurities serving as an acceptor or a donor is used, for example.

The gate electrode TRG2*g* of the transfer transistor TRG2 is provided on the front surface F1 between the floating diffusion region FD2 and the photodiode PD or the impurity layer 52 as an example of a second voltage application section. The gate electrode TRG2*g* is provided on the front surface F1 with the gate insulating film therebetween, and is electrically insulated from the semiconductor layer 51. The gate electrode TRG2*g* can apply a voltage to the semiconductor layer 51 between the floating diffusion region FD2 and the photodiode PD or the impurity layer 52 to bring the transfer transistor TRG2 into a conductive state or a non-conductive state. For the gate electrode TRG2*g*, a conductive material such as metal or doped polysilicon is used, for example.

The gate electrode TRG1*g*, the impurity layer 52, and the floating diffusion region FD1 constitute the transfer transistor TRG1, and can transfer a charge from the impurity layer 52 to the floating diffusion region FD1 by the gate voltage applied to the gate electrode TRG1*g*.

The gate electrode TRG2*g*, the impurity layer 52, and the floating diffusion region FD2 constitute the transfer transistor TRG2, and can transfer a charge from the impurity layer 52 to the floating diffusion region FD2 by the gate voltage applied to the gate electrode TRG2*g*.

The charges transferred to the floating diffusion regions FD1 and FD2 are accumulated in the floating diffusion region FD1 and the additional capacitor FDL1 in FIG. 3, or the floating diffusion region FD2 and the additional capacitor FDL2 in FIG. 3.

The waveguide 55 extends so as to gradually become thinner from a back surface F2 of the semiconductor layer 51 toward a photodiode PD on a front surface F1 side. The area of an end surface E1 of the waveguide 55 on the front surface F1 side is smaller than the area of an end surface E2 of the waveguide 55 on the back surface F2 side. The waveguide 55 is provided up to the vicinity of the surface of an impurity layer 52, but does not reach the photodiode PD. That is, the impurity layer 52 is present between the waveguide 55 and the photodiode PD for charge transfer. The waveguide 55 includes a material different from the material of the semiconductor layer 51. Similar to an on-chip lens 47, a resin material such as a styrene resin, an acrylic resin, a styrene-acrylic copolymer resin, or a siloxane resin is used for the waveguide 55, for example. Further, the waveguide 55 may include $SiO_2$, MgF, SiOC, or the like as a low refractive index material, or a-Si, PolySi, SiN, $Ta_2O_5$, $Al_2O_3$, $TiO_2$, $HfO_2$, $Nb_2O_{25}$, or the like as a high refractive index material.

The waveguide 55 reflects at least a part of incident light at the interface with the semiconductor layer 51 and guides the incident light to the photodiode PD.

The waveguide 55 has an area equal to or larger than the area of the opening OP at the end surface E2 on the back surface F2 side of the semiconductor layer 51, and has an area equal to or smaller than the area of the photodiode PD at the end surface E1 on the front surface F1 side. In addition, the area of the end surface E1 of the waveguide 55 is smaller than the area of the end surface E2. The side surfaces of the waveguide 55 are inclined in a direction perpendicular to the front surface F1, the back surface F2, and the end surfaces E1 and E2. That is, the waveguide 55 is formed so as to gradually become thinner from the back surface F2 to the front surface F1, and the side surface between the front surface F1 and the back surface F2 has a tapered shape. With this configuration, the waveguide 55 can guide the incident light from the relatively large opening OP to the photodiode PD smaller than the opening OP.

The waveguide 55 guides the incident light to the photodiode PD, whereby the quantum efficiency in the photodiode PD can be increased.

Furthermore, even if the layout area of the photodiode PD on the front surface F1 is reduced, the photodiode PD can receive a large amount of incident light due to the waveguide 55 guiding the incident light. Therefore, due to the formation of the waveguide 55, the photodiode PD can maintain high quantum efficiency and quantum efficiency even if the layout area is reduced. When the layout area of the photodiode PD is small, the contact area between the photodiode PD and the semiconductor layer 51 is also small, so that dark current can also be suppressed. That is, the pixel 10 according to the third embodiment can suppress dark current while maintaining the quantum efficiency of the photodiode PD, and achieve both high sensitivity and high resolution.

The refractive index of the waveguide 55 is preferably higher than the refractive index of the semiconductor layer 51. In this case, the incident light in the waveguide 55 can be totally reflected at the interface between the waveguide 55 and the semiconductor layer 51. Preferably, the taper angle θt of the side surface of the waveguide 55 is smaller than the critical angle of the interface between the waveguide 55 and the semiconductor layer 51. This is because, with this configuration, the light incident from the direction perpendicular to the back surface F2 is easily totally reflected at the interface between the waveguide 55 and the semiconductor layer 51. The waveguide 55 can guide more incident light to the photodiode PD by totally reflecting the incident light at the interface between the waveguide 55 and the semiconductor layer 51. With this configuration, the pixel 10 can further improve the quantum efficiency in the photodiode PD.

In a case where the antireflection film 43 is not provided, the refractive index of the waveguide 55 is preferably lower than the refractive indexes of the on-chip lens 47 and the planarization film 46. With this configuration, the incident light is not reflected at the interface between the on-chip lens 47 or the planarization film 46 and the waveguide 55, and can enter the waveguide 55.

The gate electrode TRG1*g* is electrically connected to the wire M41 as a second wire via the vias V11, V21, V31, and V41 and the wires M11, M21, and M31. That is, the wire M41 is provided on the front surface F1 side and is connected to the gate electrode TRG1g. The gate electrode TRG2g is electrically connected to the wire M42 as a third wire via the vias V12, V22, V32, and V42 and the wires M12, M22, and M32. That is, the wire M42 is provided on the front surface F1 side and is connected to the gate electrode TRG2g. The vertical driver 22 in FIG. 2 is connected to the wires M41 and M42, and controls the potentials of the gate electrodes TRG1g and TRG2g via the wires M41 and M42. As a result, the vertical driver 22 can drive the transfer transistors TRG1 and TRG2. Conductive metal such as copper is used for the wires M11 to M42 and Mbias and the vias V11 to V42 and Vbias, for example. In FIG. 5, the wires M11 to M42 constitute a four-layer structure, but the number of wiring layers is not limited, and may be less than or more than four.

Note that the wires M11, M12, and Mbias are formed in the same wiring layer, and the wires M21 and M22 are formed in the same wiring layer. The wires M31 and M32 are formed in the same wiring layer, and the wires M41 and M42 are formed in the same wiring layer. The wires M11 and M12 are electrically connected to the gate electrodes TRG1g and TRG2g of the transfer transistors TRG1 and TRG2 via vias V11 and V12, respectively.

The additional capacitors FDL1 and FDL2 may be, for example, MoM, MIM, or MOS capacitors configured by wiring in the same layer as the wires M21 and M22 or the wires M31 and 32. Although not illustrated here, the additional capacitors FDL1 and FDL2 are electrically connected to the floating diffusion regions FD1 and FD2, respectively, and can store charges together with the floating diffusion regions FD1 and FD2. In addition, the additional capacitors FDL1 and FDL2 overlap the photodiode PD in a plan view from the front surface F1 side. With this configuration, the arrangement area of the pixels 10 can be reduced. It is obvious that the additional capacitors FDL1 and FDL2 may be configured by a conductive layer different from the wires M21 and M22 and the wires M31 and 32.

An interlayer insulating film 62 is provided on the front surface F1 of the semiconductor layer 51 and covers the wires M11 to M42 and Mbias, vias V11 to V42 and Vbias, and the like. As the interlayer insulating film 62, an insulating film such as a silicon oxide film is used, for example.

Next, the operation of the ranging device 100 will be described.

Figure 6:
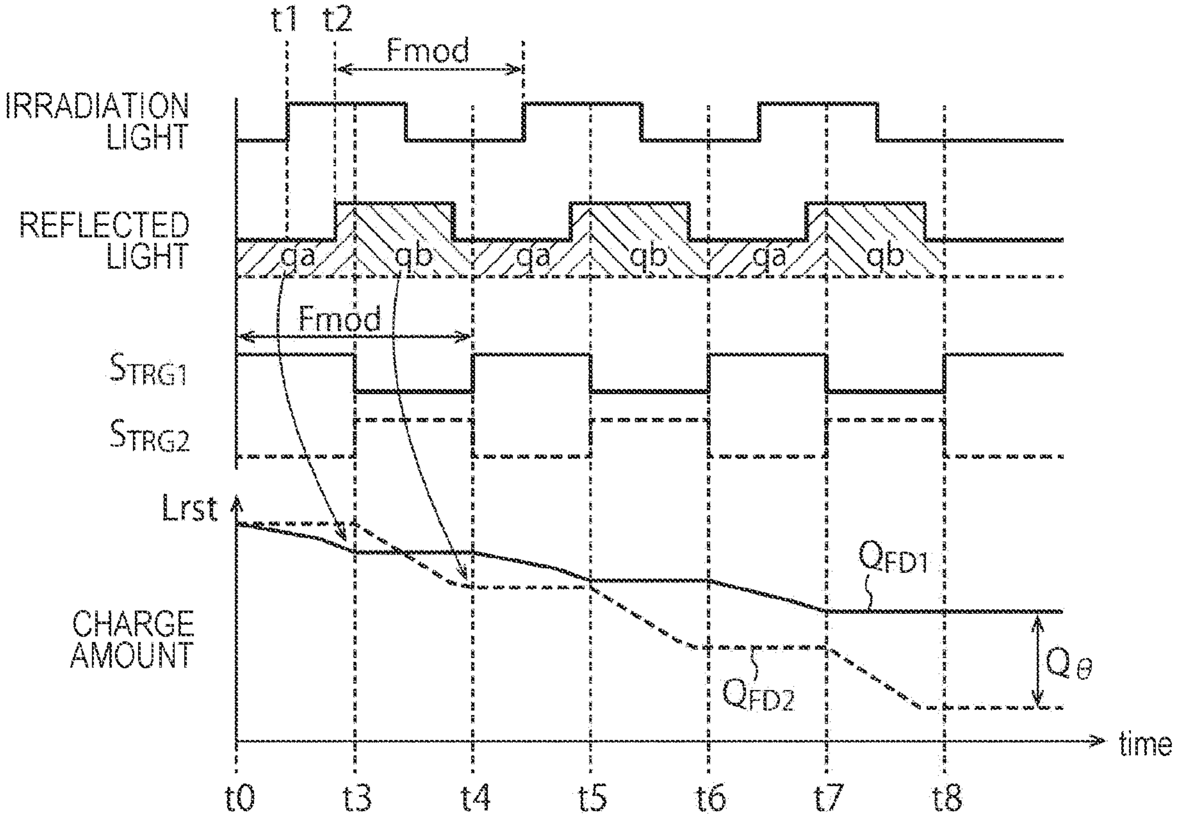
FIG. 6 is a timing chart depicting an example of the operation of the ranging device according to the first embodiment.

FIG. 6 is a timing chart depicting an example of the operation of the ranging device according to the first embodiment. The horizontal axis represents time. The vertical axis represents the signal level (intensity) of the irradiation light, the signal level (intensity) of the reflected light, gate signals $S_{TRG1}$ and $S_{TRG2}$, and charge amounts $Q_{FD1}$ and $Q_{FD2}$ of charges accumulated in the floating diffusion regions FD1 and FD2 or the additional capacitors FDL1 and FLD2. Note that the gate signals $S_{TRG1}$ and $S_{TRG2}$ are signals respectively applied to the gate electrodes TRG1g and TRG2g depicted in FIG. 3 or 5.

First, it is assumed that the light receiving element 1 is in a reset state. The light emitting element 2 emits irradiation light. The frequency of the irradiation light is Fmod. The irradiation light is reflected by the object M and received by the light receiving element 1. The frequency of the reflected light is the same as that of the irradiation light, that is, Fmod. On the other hand, a time Δt from the emission of the irradiation light until the irradiation light is reflected by the object M and returns as reflected light is a delay time (ToF) of the reflected light with respect to the irradiation light. If the delay time Δt is found, the distance from the ranging device 100 to the object M can be calculated on the basis of the light speed c. However, since a phase difference occurs between the irradiation light and the reflected light according to the delay time Δt (from t1 to t2), the iToF method uses a phase difference α between the irradiation light and the reflected light to calculate the distance (depth information) D from the ranging device 100 to the object M.

The distance D is expressed by Expression 1.

$$D=(c\times\Delta t)/2=(c\times\alpha))/(4\pi\times F\text{ mod}) \quad \text{(Expression 1)}$$

When the phase difference α is known, the distance D can be calculated by Expression 1.

In addition, the phase difference α is represented by Expression 2.

$$\alpha=\arctan((Q_{90}-Q_{270})/(Q_0-Q_{180})) \quad \text{(Expression 2)}$$

$Q_\theta$ (θ=0, 90, 180, 270) indicates a difference (potential difference) in amount of charges accumulated in the floating diffusion regions FD1 and FD2 or the additional capacitors FDL1 and FDL2 when the phases of the gate signals $S_{TRG1}$ and $S_{TRG2}$ are shifted by θ with respect to the irradiation light. That is, the iToF method calculates the phase difference α using four pieces of image data obtained when the phases of the gate signals $S_{TRG1}$ and $S_{TRG2}$ with respect to the irradiation light are shifted by a predetermined value (for example, 0 degrees, 90 degrees, 180 degrees, and 270 degrees). Then, the distance D is calculated using the phase difference α. This calculation is only required to be executed by the signal processor 26 in FIG. 2.

The calculation of $Q_\theta$ will be described below with reference to FIG. 6.

The gate signals $S_{TRG1}$ and $S_{TRG2}$ are applied to the gate electrodes TRG1g and TRG2g of the transfer transistors TRG1 and TRG2. The gate signals $S_{TRG1}$ and $S_{TRG2}$ are pulse signals having a frequency Fmod that is the same as the frequency of the irradiation light. The gate signal $S_{TRG1}$ and the gate signal $S_{TRG2}$ are opposite-phase signals shifted from each other by 180 degrees, and are set to be shifted from the irradiation light by a predetermined phase θ (any of 0 degrees, 90 degrees, 180 degrees, and 270 degrees). For example, the phase of the gate signal $S_{TRG1}$ is set to be shifted by 90 degrees (θ=90) from the phase of the irradiation light in FIG. 6. Since the gate signal $S_{TRG2}$ is opposite in phase to the gate signal $S_{TRG1}$, the phase of the gate signal $S_{TRG2}$ is also shifted with the phase of the gate signal $S_{TRG1}$.

Since the gate signals $S_{TRG1}$ and $S_{TRG2}$ are opposite in phase, the transfer transistors TRG1 and TRG2 in FIGS. 3 and 5 are alternately conductive. For example, from t0 to t3, the gate signal $S_{TRG1}$ is at a high level, so that the transfer transistor TRG1 is conductive. On the other hand, the gate signal $S_{TRG2}$ is at a low level, so that the transfer transistor TRG2 is not conductive. At this time, charges qa generated in the photodiode PD are transferred to the floating diffusion region FD1 and the additional capacitor FDL1 via the transfer transistor TRG1. On the other hand, the charges qa are not transferred to the floating diffusion region FD2 and the additional capacitor FDL2. When an amount of charges in the floating diffusion region FD1 and the additional capacitor FDL1 is defined as a charge amount $Q_{FD1}$, the charge amount $Q_{FD1}$ changes (decreases) by the amount of charges qa. On the other hand, the charges are not transferred to the floating diffusion region FD2 and the additional capacitor FDL2. Therefore, when an amount of charges in the floating diffusion region FD2 and the additional capacitor FDL2 is defined as a charge amount $Q_{FD2}$, the charge amount $Q_{FD2}$ does not change.

Next, from t3 to t4, the gate signal $S_{TRG2}$ is at a high level, so that the transfer transistor TRG2 is conductive. On the other hand, the gate signal $S_{TRG1}$ is at a low level, so that the transfer transistor TRG1 is not conductive. At this time, the charges qb generated in the photodiode PD are transferred to the floating diffusion region FD2 and the additional capacitor FDL2 via the transfer transistor TRG2. On the other hand, the charges qb are not transferred to the floating diffusion region FD1 and the additional capacitor FDL1. Therefore, the charge amount $Q_{FD2}$ changes (decreases) by the amount of charges qb. On the other hand, the charges are not transferred to the floating diffusion region FD1 and the additional capacitor FDL1. Therefore, the charge amount $Q_{FD1}$ does not change.

The operation of the light receiving element 1 from t4 to t5 and from t6 to t7 is similar to the operation of the light receiving element 1 from t0 to t3. In addition, the operation of the light receiving element 1 from t5 to t6 and from t7 to t8 is similar to the operation of the light receiving element 1 from t3 to t4. In this manner, the transfer transistors TRG1 and TRG2 alternately and periodically repeat the conductive state and the non-conductive state. With this configuration, the charges qa generated in the photodiode PD are gradually accumulated (integrated) in the floating diffusion region FD1 and the additional capacitor FDL1, and the charges qb generated in the photodiode PD are gradually accumulated (integrated) in the floating diffusion region FD2 and the additional capacitor FDL2. By distributing the charges qa and qb generated in the photodiode PD on the basis of the frequency Fmod of the irradiation light and the reflected light, the difference $Q_{90}$ in charge amount according to the phase difference α of the reflected light with respect to the irradiation light increases. When the difference $Q_{90}$ in charge amount is sufficiently large, the light receiving element 1 outputs the potentials of the floating diffusion regions FD1 and FD2 via the vertical signal lines 29A and 29B in FIG. 3.

The light receiving processing described above is executed for each of θ=0, 90, 180, and 270, and differences $Q_0$, $Q_{90}$, $Q_{180}$, and $Q_{270}$ in charge amount are detected. As a result, four pieces of image data (that is, $Q_0$, $Q_{90}$, $Q_{180}$, and $Q_{270}$) obtained when the phases of the gate signals $S_{TRG1}$ and $S_{TRG2}$ with respect to the irradiation light are shifted are obtained. The signal processor 26 calculates the phase difference α from Expression 2 using the four pieces of image data ($Q_0$, $Q_{90}$, $Q_{180}$, $Q_{270}$). Further, the signal processor 26 calculates the distance D from Expression 1 using the phase difference α.

In this manner, the ranging device 100 according to the present disclosure obtains the distance D (depth information) using the iToF method.

As described above, the light receiving element 1 according to the present embodiment has a back-illuminated structure having the wiring structure on the front surface F1 of the semiconductor layer 51 and the on-chip lens 47 on the back surface F2. Therefore, the incident light is not blocked by the wires M11 to M42 and Mbias, and the like, and reaches the photodiode PD without being attenuated so much through the high-transmittance on-chip lens 47 and the semiconductor layer 51. Therefore, an amount of light to be photoelectrically converted in the semiconductor layer 51 can be increased, and the quantum efficiency (Qe), that is, the sensitivity of the pixel 10 can be improved.

In addition, according to the present embodiment, the waveguide 55 is provided to extend from the back surface F2 of the semiconductor layer 51 toward the photodiode PD on the front surface F1 side. The waveguide 55 reflects at least a part of incident light at the interface with the semiconductor layer 51 and guides the incident light to the photodiode PD. As a result, the quantum efficiency (sensitivity) of the light receiving element 1 according to the present embodiment can be improved. In order for the waveguide 55 to reflect incident light at the interface with the semiconductor layer 51, the refractive index of the waveguide 55 is preferably higher than the refractive index of the semiconductor layer 51. With this configuration, the sensitivity of the light receiving element 1 can be further improved.

Further, according to the present embodiment, the photodiode PD does not include an impurity diffusion layer in the semiconductor layer 51 (for example, a silicon substrate), but includes a material that is different from the material of the semiconductor layer 51 and that is in contact with the back surface F2 of the semiconductor layer 51. Due to the use of a material (for example, germanium, InGaAs, CIGS, or Qdot) having higher photoelectric conversion efficiency than silicon as the photodiode PD, the quantum efficiency (sensitivity) of the light receiving element 1 can be further improved.

In addition, since the photodiode PD is provided separately from the semiconductor layer 51, it is not necessary to increase the thickness of the semiconductor layer 51 in consideration of improvement in quantum efficiency. Since the semiconductor layer 51 can be thinned, it is not necessary to increase the depth of the inter-pixel isolation section 61, whereby the formation of the inter-pixel isolation section 61 is facilitated. Furthermore, even if the inter-pixel isolation section 61 is relatively shallow, leakage of incident light to adjacent pixels can be efficiently prevented, and crosstalk can be effectively suppressed. This can improve the SNR and improve the resolution.

Furthermore, when the semiconductor layer 51 is reduced in thickness, the thickness of the waveguide 55 is reduced, so that the length of the path of the incident light in the waveguide 55 is decreased. As a result, an amount of light leaking from the waveguide 55 decreases, and the waveguide 55 can guide more incident light to the photodiode PD. Thus, the quantum efficiency of the light receiving element 1 can be further enhanced.

Second Embodiment

Figure 7:
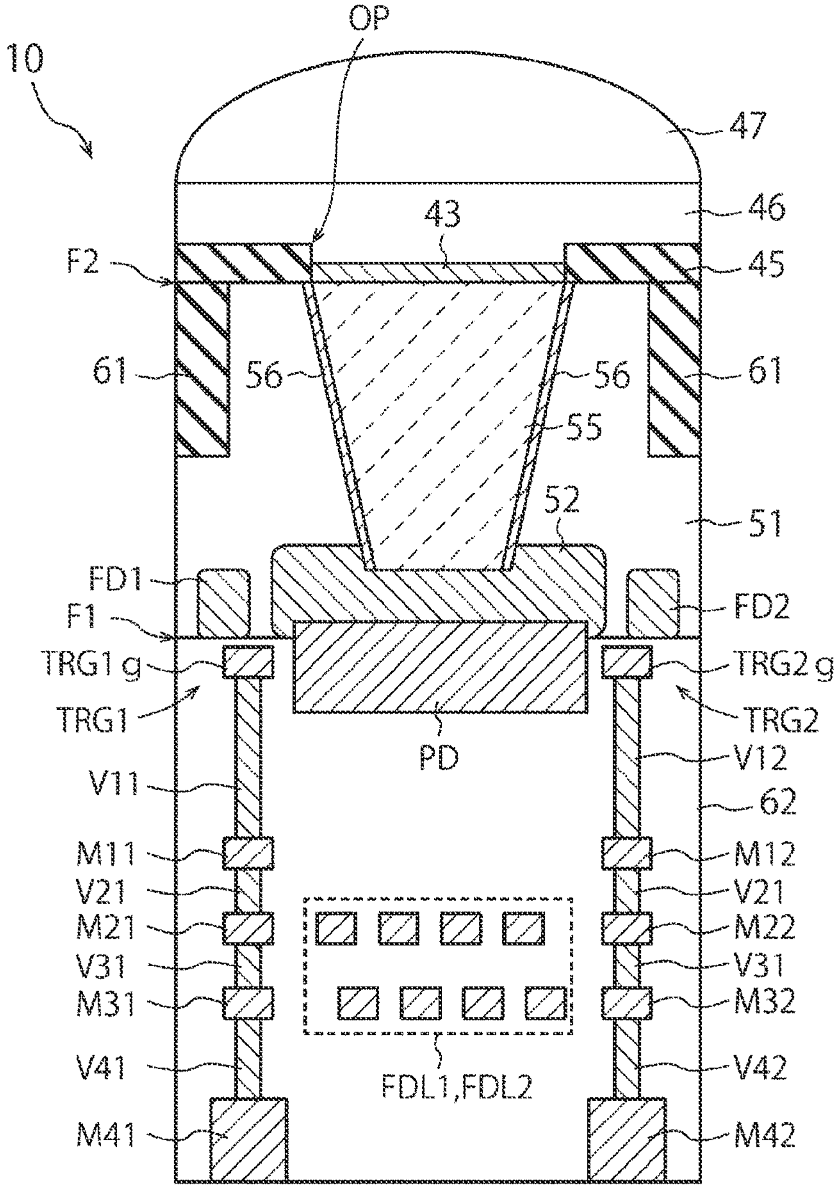
FIG. 7 is a cross-sectional view depicting a configuration example of a pixel according to a second embodiment.

FIG. 7 is a cross-sectional view depicting a configuration example of a pixel 10 according to the second embodiment. The light receiving element 1 according to the second embodiment further includes a metal layer 56 provided on a side surface of a waveguide 55. It is only sufficient that a metal material that reflects light is used for the metal layer 56, and for example, a metal material such as tungsten (W), aluminum (Al), or copper (Cu) is used. Even if the refractive index of the waveguide 55 is lower than the refractive index of a semiconductor layer 51, the metal layer 56 reflects incident light in the waveguide 55, and thus, the waveguide 55 can guide the incident light to a photodiode PD. As described above, when the metal layer 56 is provided, the quantum efficiency of the light receiving element 1 can be increased even if the tropism ratio of the waveguide 55 is small. The other configurations of the second embodiment may be similar to the corresponding configurations of the first embodiment. As a result, the second embodiment can also obtain the effect of the first embodiment.

Third Embodiment

Figure 8:
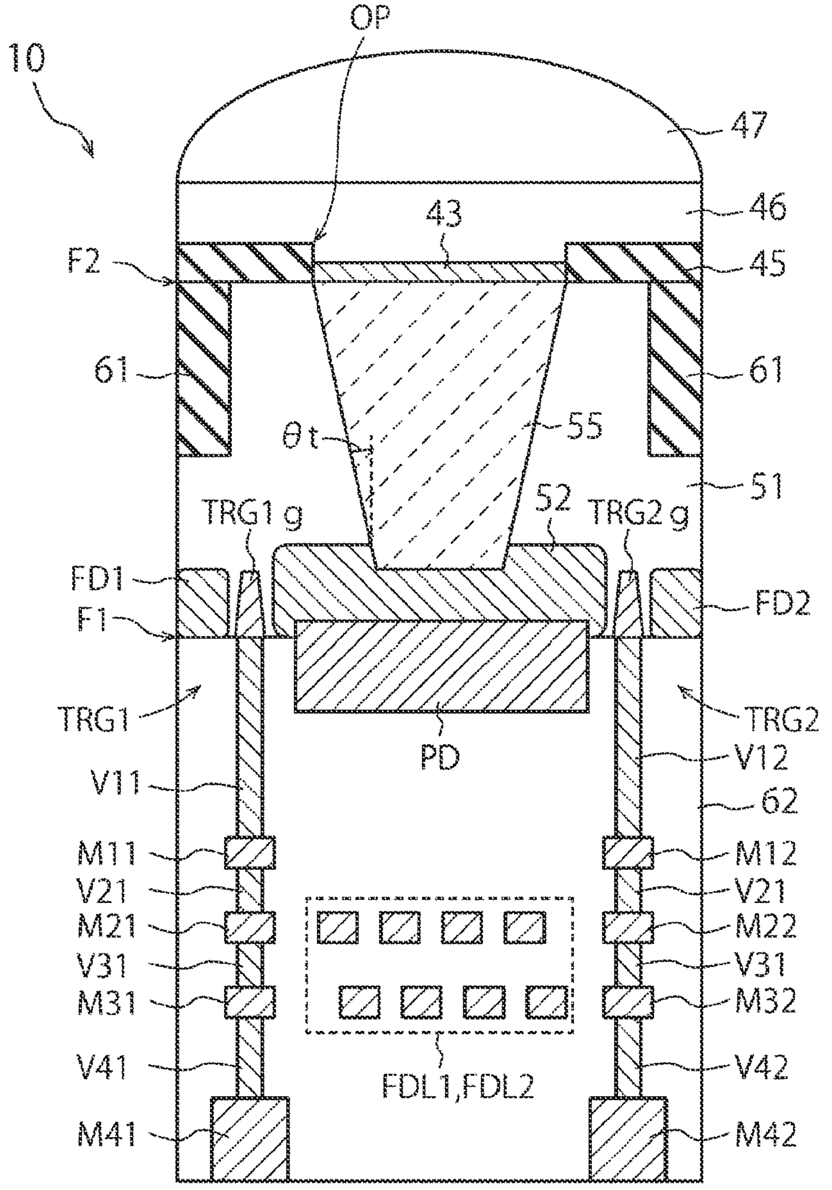
FIG. 8 is a cross-sectional view depicting a configuration example of a pixel according to a third embodiment.

FIG. 8 is a cross-sectional view depicting a configuration example of a pixel 10 according to the third embodiment.

According to the third embodiment, gate electrodes TGR1*g* and TGR2*g* are embedded in a semiconductor layer 51 from a front surface F1 to form a vertical gate structure. With this configuration, transfer transistors TRG1 and TRG2 can be conductive even at a low gate voltage, whereby the charge transfer rate can be further increased.

In addition, since the gate electrodes TGR1*g* and TGR2*g* are provided between an impurity layer 52 or a photodiode PD and floating diffusion regions FD1 and FD2, it is possible to prevent direct entry of the incident light into the floating diffusion regions FD1 and FD2. As a result, parasitic light sensitivity (PLS) can be reduced. The other configurations of the third embodiment may be similar to the corresponding configurations of the first embodiment. As a result, the third embodiment can also obtain the effect of the first embodiment.

Fourth Embodiment

Figure 9:
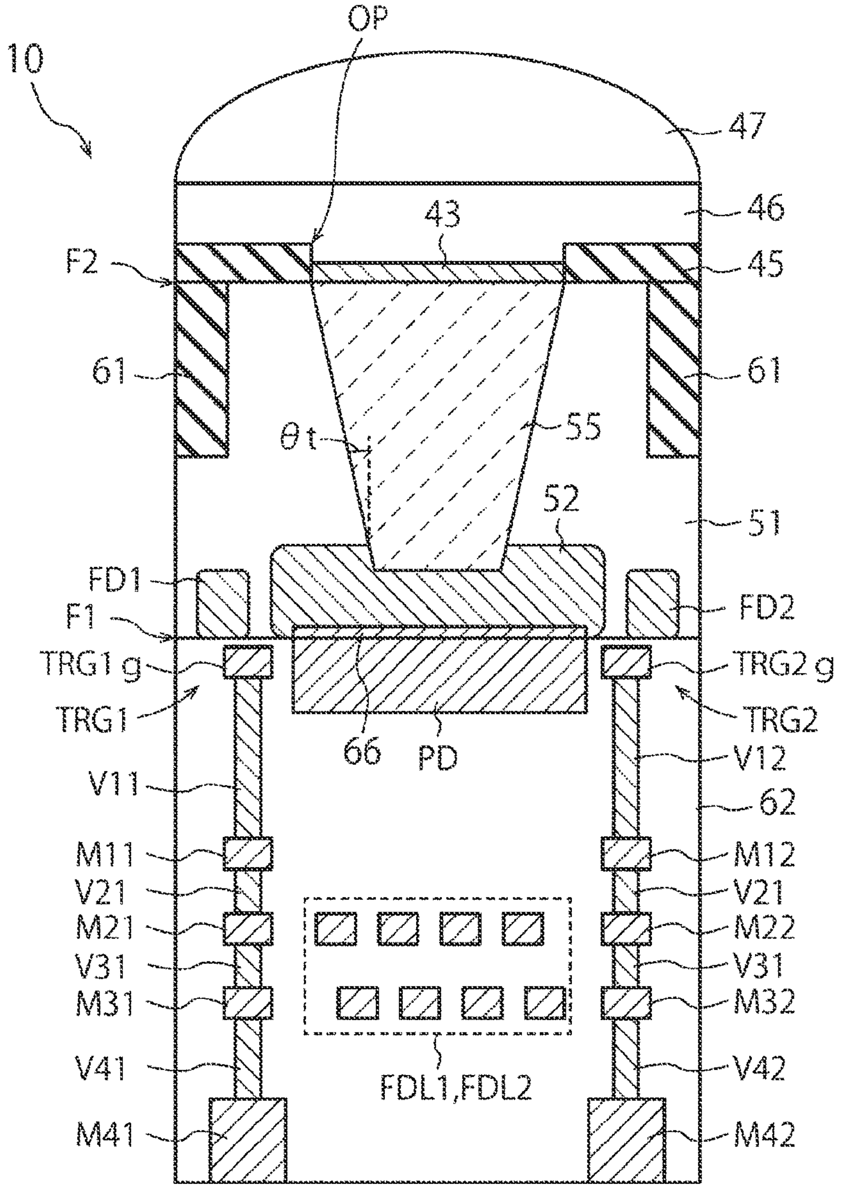
FIG. 9 is a cross-sectional view depicting a configuration example of a pixel according to a fourth embodiment.

FIG. 9 is a cross-sectional view depicting a configuration example of a pixel 10 according to the fourth embodiment. The pixel 10 according to the fourth embodiment further includes a mixture layer 66 provided between a photodiode PD and a semiconductor layer 51 and obtained by mixing the material of the photodiode PD and the material of the semiconductor layer 51. For example, in a case where the semiconductor layer 51 is silicon and the photodiode PD is germanium, the mixture layer 66 is a SiGe layer. The effects of the present disclosure are not eliminated even if the mixture layer 66 is provided between the photodiode PD and the semiconductor layer 51 as described above. In a case where the SiGe layer is provided as the mixture layer 66, the fourth embodiment provides an effect that the band gap between the photodiode PD and the semiconductor layer 51 can be continuously changed by controlling the additive ratio of germanium (Ge). The other configurations of the fourth embodiment may be similar to the corresponding configurations of the first embodiment. As a result, the fourth embodiment can also obtain the effect of the first embodiment.

Fifth Embodiment

Figure 10:
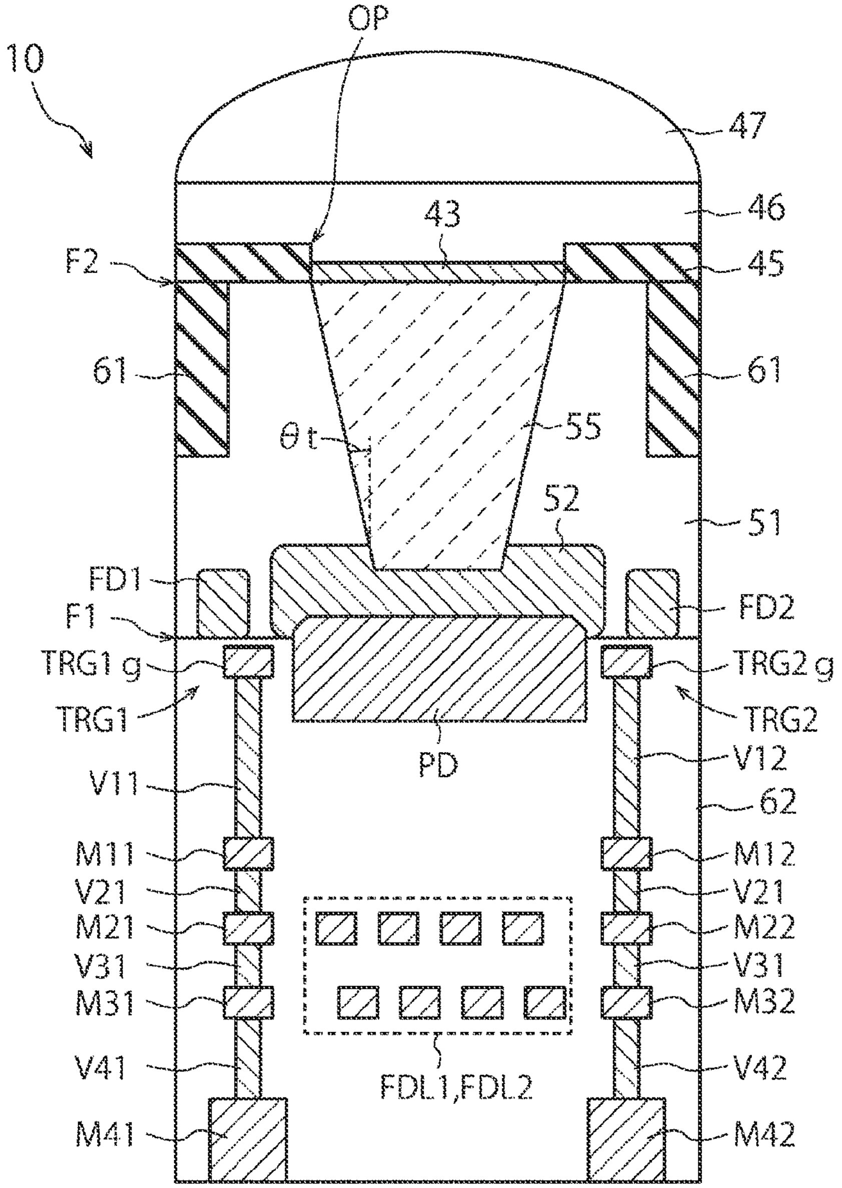
FIG. 10 is a cross-sectional view depicting a configuration example of a pixel according to a fifth embodiment.

FIG. 10 is a cross-sectional view depicting a configuration example of a pixel 10 according to the fifth embodiment. In the pixel 10 according to the fifth embodiment, the upper portion of a photodiode PD is embedded in an impurity layer 52 from a front surface F1 of a semiconductor layer 51. Since the upper portion of the photodiode PD is embedded in the impurity layer 52, charges are easily taken into the impurity layer 52 from the photodiode PD. As a result, the charge transfer rate is further increased.

Sixth Embodiment

Figure 11:
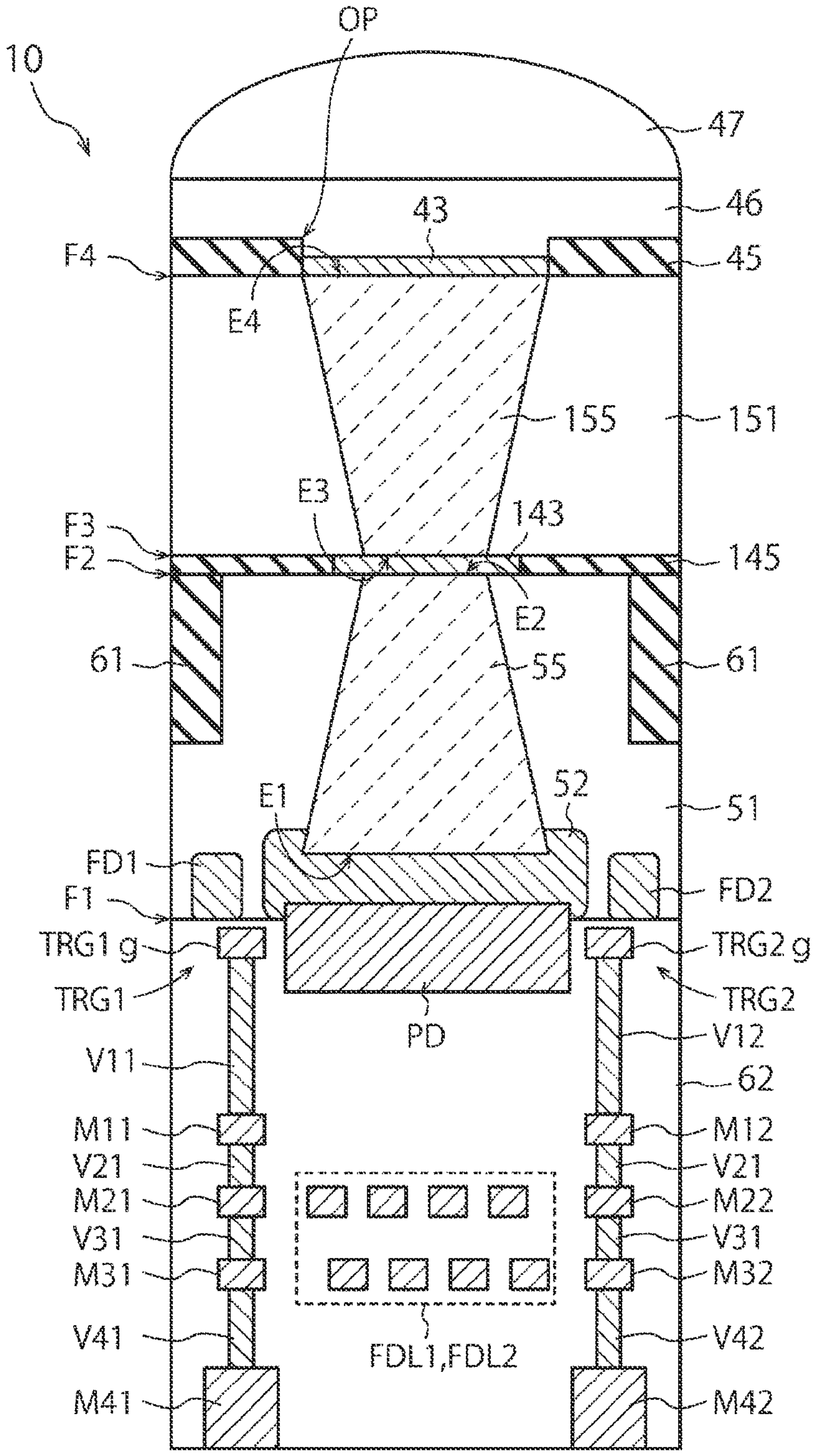
FIG. 11 is a cross-sectional view depicting a configuration example of a pixel according to a sixth embodiment.

FIG. 11 is a cross-sectional view depicting a configuration example of a pixel 10 according to the sixth embodiment. The pixel 10 according to the sixth embodiment further includes an additional semiconductor layer 151 and an additional waveguide 155 provided between an on-chip lens 47 or a planarization film 46 and a back surface F2 of a semiconductor layer 51. An antireflection film 143 is provided between the waveguide 155 and the waveguide 55. A light shielding film 145 is provided between the semiconductor layer 151 and the semiconductor layer 51.

It is only sufficient that the same materials as the semiconductor layer 51 and the waveguide 55 are used for the semiconductor layer 151 and the waveguide 155, respectively. It is only sufficient that the same materials as the antireflection film 43 and the light shielding film 45 are used for the antireflection film 143 and the light shielding film 145, respectively.

The semiconductor layer 151 has a surface F3 facing the back surface F2 of the semiconductor layer 51 and a surface F on a side opposite to the surface F3. The antireflection film 143 and the light shielding film 145 are provided between the back surface F2 of the semiconductor layer 51 and the surface F3 of the semiconductor layer 151. The antireflection film 43 and the light shielding film 45 are provided on the surface F4 of the semiconductor layer 151.

The waveguide 155 has an end surface E4 substantially equal to or larger than an opening OP on the surface F4 side, and has an end surface E3 substantially equal to or slightly smaller than the end surface E2 on the back surface F2 side of the waveguide 55 on the surface F3 side. The area of the end surface E3 of the waveguide 155 is smaller than the area of the end surface E4 of the waveguide 155. Therefore, the waveguide 155 extends so as to gradually become thinner from the surface F4 toward the surface F3 of the semiconductor layer 151. The side surfaces of the waveguide 155 are inclined in a direction perpendicular to the surface F3, the surface F4, and the end surfaces E3 and E4. That is, the side surfaces of the waveguide 155 between the end surface E4 and the end surface E3 have a tapered shape. The waveguide 155 reflects at least a part of the incident light at the side surfaces, that is, the interface with the semiconductor layer 151 and guides the incident light to the waveguide 55. With this configuration, the waveguide 155 can guide the incident light from the relatively large opening OP to the end surface of the waveguide 55 smaller than the opening OP on the back surface F2 side. As a result, the waveguide 155 can guide the incident light having passed through the opening OP to the waveguide 55 without much leakage.

On the other hand, the waveguide 55 extends so as to gradually become wider from the back surface F2 of the semiconductor layer 51 toward the photodiode PD on the front surface F1 side. The area of the end surface E1 of the waveguide 55 on the front surface F1 side is greater than the area of the end surface E2 of the waveguide 55 on the back surface F2 side. The waveguide 55 is provided up to the vicinity of the surface of an impurity layer 52, but does not reach the photodiode PD.

The waveguide 55 reflects at least a part of incident light at the interface with the semiconductor layer 51 and guides the incident light to the photodiode PD.

The waveguide 55 has an area equal to or larger than the area of the end surface E3 of the waveguide 155 on the end surface E2, and has an area equal to or smaller than the area of the photodiode PD on the front surface F1 side. The waveguide 55 is formed so as to be gradually wider from the back surface F2 to the front surface F1, and the side surfaces between the front surface F1 and the back surface F2 have a tapered shape. As a result, the waveguide 55 can sufficiently irradiate the photodiode PD with incident light from a relatively small end surface.

As described above, the waveguides 55 and 155 are formed in an hourglass shape. An increase in size of the opening OP of the waveguide 155 makes it possible to guide a large amount of incident light into the pixel 10. The waveguide 55 introduces the incident light guided by the waveguide 155 into an internal region surrounded by the metal film 145 and the inter-pixel isolation section 61. A metal material such as tungsten (W), aluminum (Al), or copper (Cu) is used for the metal film 145. The incident light repeats reflection until photoelectric conversion is performed in the internal region surrounded by the metal film 145 and the inter-pixel isolation section 61. Here, the reduction in the opening area of the waveguide 55 on the end surface E2 makes it possible to reduce the probability that the incident light introduced into the internal region travels to the outside of the pixel 10 from the end surface E2 without being photoelectrically converted. Therefore, the incident light can be confined in the internal region with the opening OP of the waveguide 155 being increased. That is, by forming the waveguides 55 and 155 in an hourglass shape in which the intermediate part is narrowed, it is possible to introduce more incident light and sufficiently photoelectrically convert the incident light. As a result, the quantum efficiency can be increased. The other configurations of the sixth embodiment may be similar to the corresponding configurations of the first embodiment.

Seventh Embodiment

Figure 12:
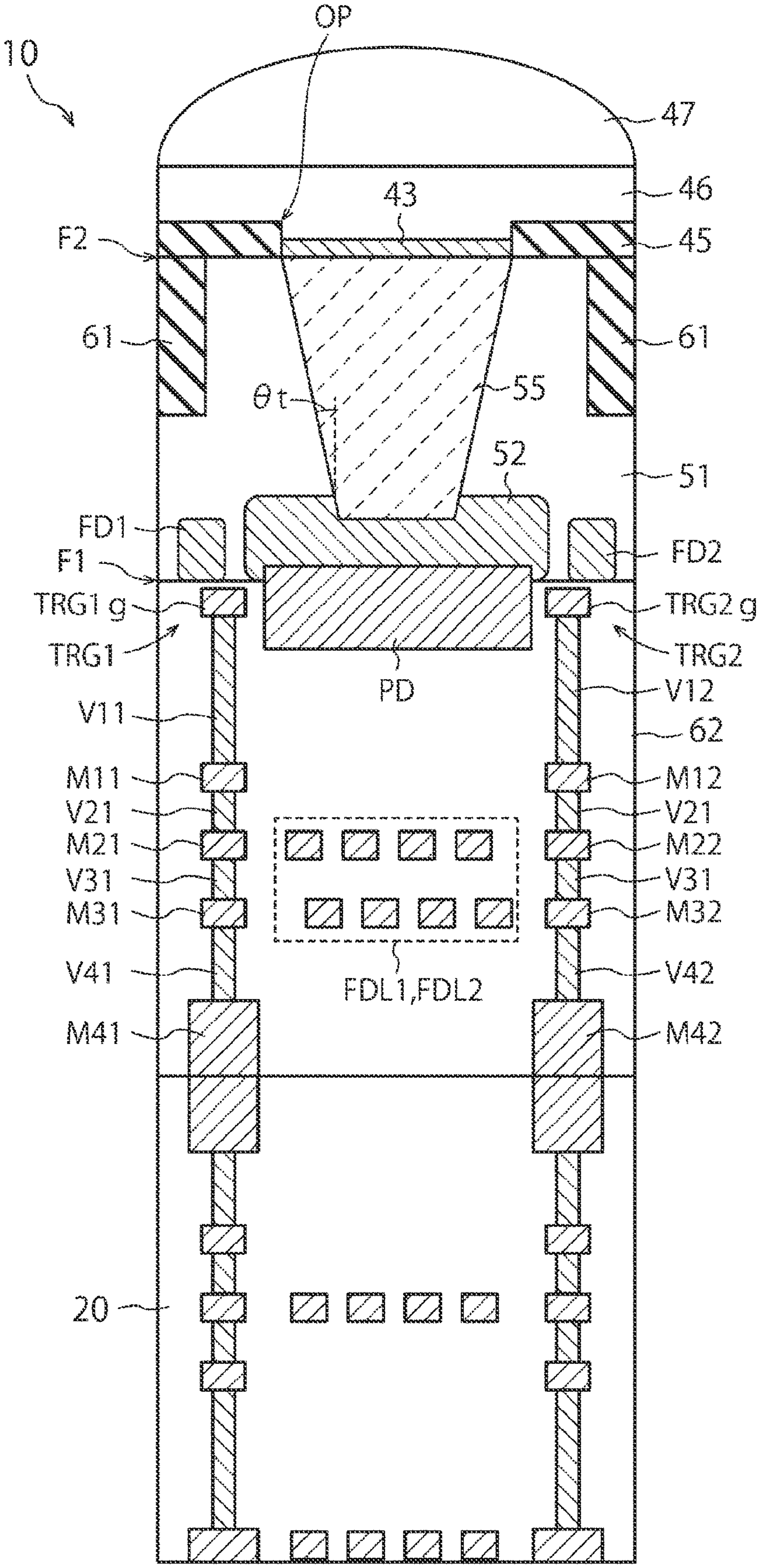
FIG. 12 is a cross-sectional view depicting a configuration example of a pixel according to a seventh embodiment.
Figure 13:
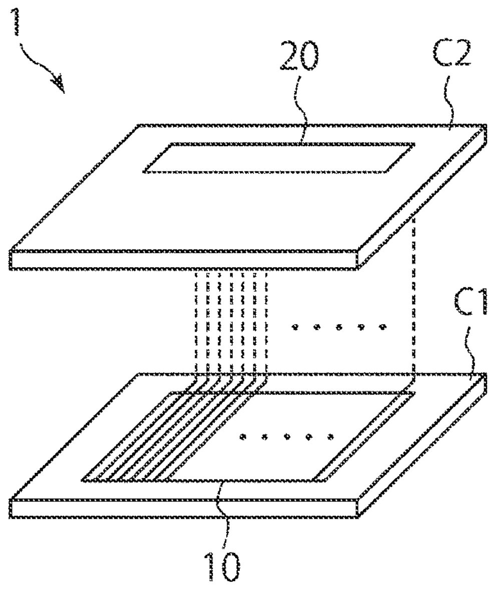
FIG. 13 is a schematic view depicting a configuration example of a light receiving element according to the seventh embodiment.

FIG. 12 is a cross-sectional view depicting a configuration example of a light receiving element 1 according to the seventh embodiment. FIG. 13 is a schematic view depicting a configuration example of the light receiving element 1 according to the seventh embodiment. The light receiving element 1 according to the seventh embodiment includes a semiconductor chip C1 of a pixel 10 and a semiconductor chip C2 of another peripheral circuit 20. The semiconductor chip C1 has, for example, a pixel array in which a plurality of pixels 10 is arrayed. The semiconductor chip C2 may be, for example, a controller of the pixel 10, and includes a complementary metal oxide semiconductor (CMOS) logic circuit 13 or the like provided on a semiconductor substrate. The semiconductor chip C1 and the semiconductor chip C2 have a laminated structure, are directly bonded (Cu—Cu bonding) to each other by wiring, and function as one device (module). As described above, the light receiving element 1 may be a module in which a plurality of semiconductor chips are laminated. With this configuration, the arrangement area of the light receiving element 1 can be reduced.

Eighth Embodiment

Figure 14:
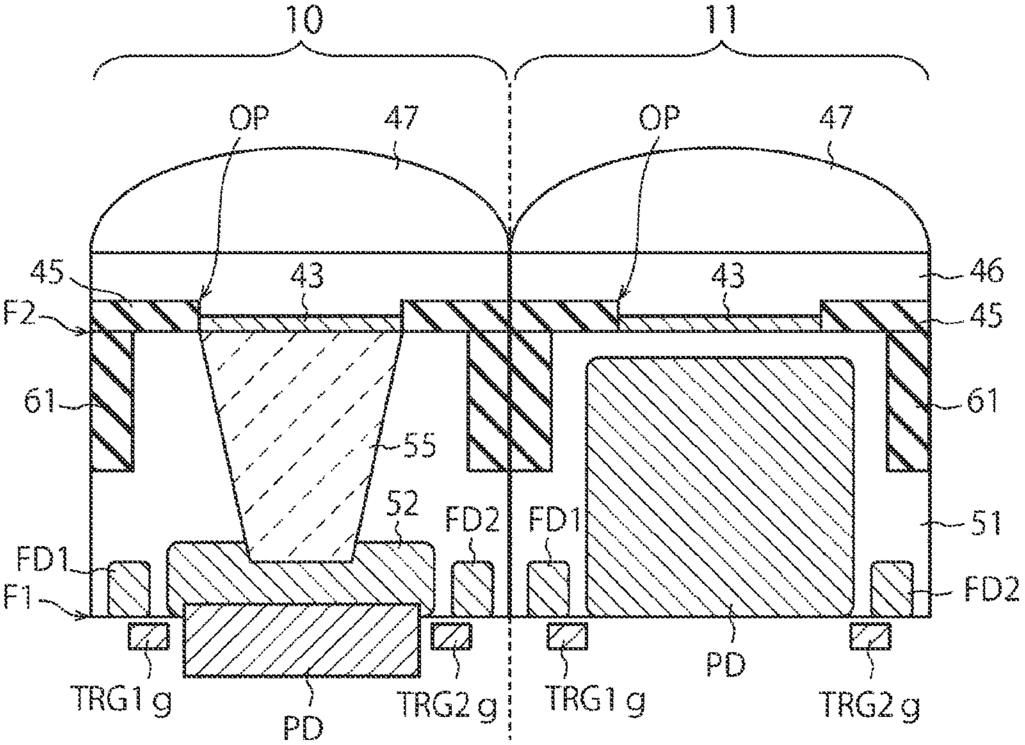
FIG. 14 is a cross-sectional view depicting a configuration example of a pixel according to an eighth embodiment.
Figure 15:
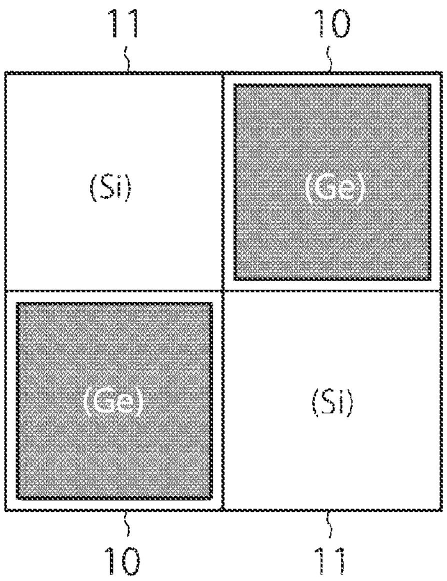
FIG. 15 is a plan view depicting a configuration example of a light receiving element according to the eighth embodiment.

FIG. 14 is a cross-sectional view depicting a configuration example of a light receiving element 1 according to the eighth embodiment. FIG. 15 is a plan view depicting the configuration example of the light receiving element 1 according to the eighth embodiment. The light receiving element 1 according to the eighth embodiment includes pixels 10 and 11 arranged adjacent to each other. The pixel 10 is a pixel according to the present disclosure, and is, for example, a pixel that uses germanium as a photodiode PD and detects short wave infrared light (SWIR). The pixel 11 is a pixel that detects near infrared light (NIR) in the photodiode PD provided in a semiconductor layer 51 (for example, a silicon substrate). Due to the configuration described above in which the pixels 10 and 11 that detect different kinds of light are alternately arranged in parallel, the light receiving element 1 can detect both SWIR and NIR. That is, the range of the detection wavelength of the light receiving element 1 can be increased. Note that, in FIG. 15, two pixels 10 and two pixels 11 are arranged, but three or more pixels may be arranged.

Ninth Embodiment

Figure 16:
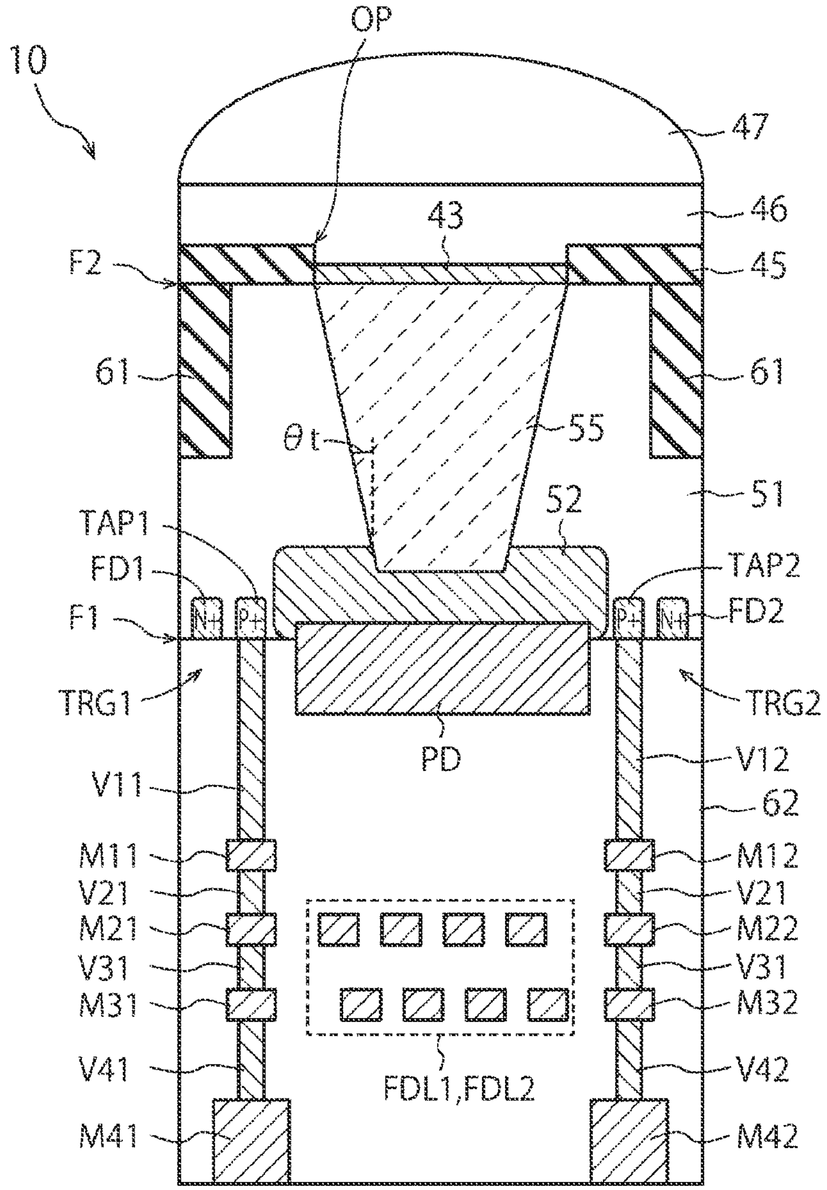
FIG. 16 is a cross-sectional view depicting a configuration example of a light receiving element according to a ninth embodiment.

FIG. 16 is a cross-sectional view depicting a configuration example of a light receiving element 1 according to the ninth embodiment. The light receiving element 1 according to the ninth embodiment includes, as an example of a first voltage application section, a first impurity layer TAP1 adjacent to a floating diffusion region FD1 on the front surface F1 and having a conductivity type opposite to that of the floating diffusion region FD1. The light receiving element 1 also includes, as an example of a second voltage application section, a second impurity layer TAP2 adjacent to a floating diffusion region FD2 on the front surface F1 and having a conductivity type opposite to that of the floating diffusion region FD2. For example, in a case where the floating diffusion regions FD1 and FD2 are thick N+ type impurity layers, the first and second impurity layers TAP1 and TAP2 are thick P+ type impurity layers. In this case, a wire M41 provided on the front surface F1 side is electrically connected to the first impurity layer TAP1. A wire M42 provided on the front surface F1 side is electrically connected to the second impurity layer TAP2.

The vertical driver 22 periodically switches the direction of a current flowing between the first impurity layer TAP1 and the second impurity layer TAP2 by alternately switching the voltages of the wires M41 and 42. Thus, the charge generated by the photodiode PD can be periodically distributed to the floating diffusion regions FD1 and FD2 alternately. As a result, the ranging device 100 can detect $Q_\theta$ ($\theta$=0, 90, 180, 270) and measure the distance D by the iToF method as in the above embodiments.

Tenth Embodiment

Figure 17:
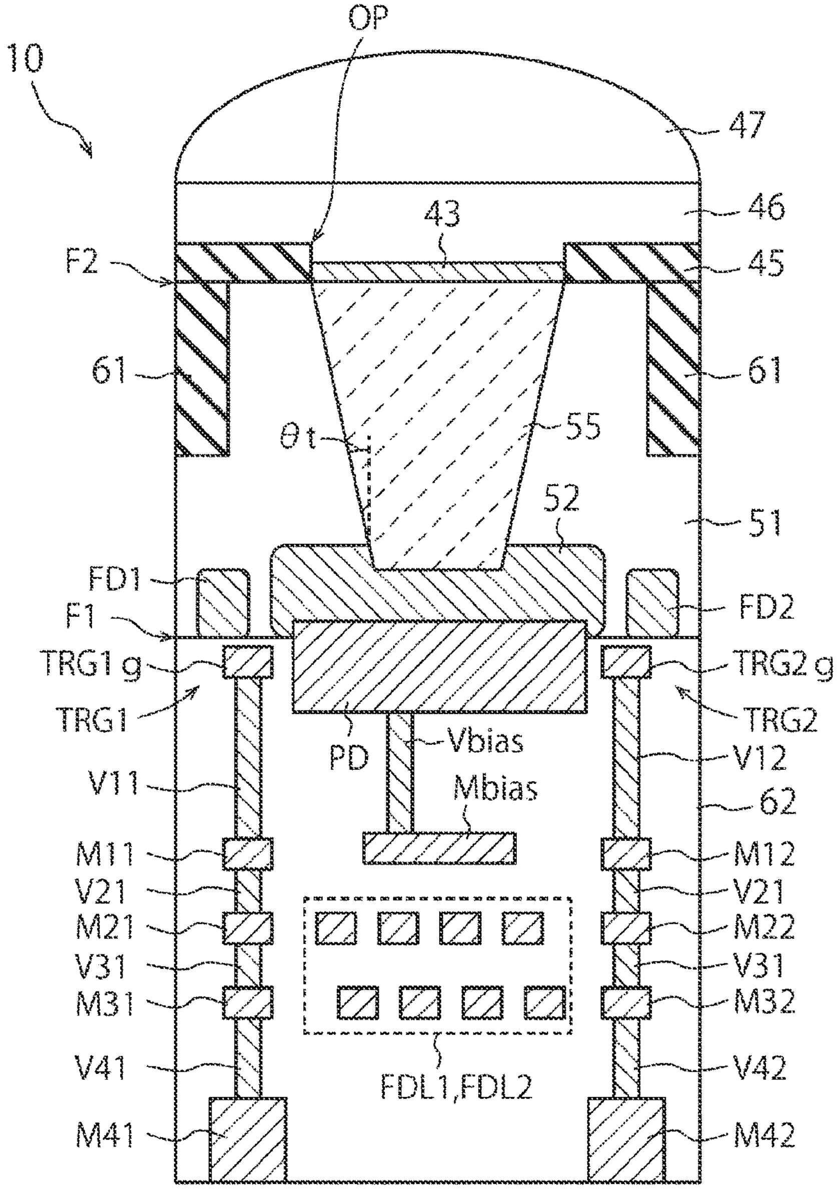
FIG. 17 is a cross-sectional view depicting a configuration example of a pixel according to a tenth embodiment.

FIG. 17 is a cross-sectional view depicting a configuration example of a pixel 10 according to the tenth embodiment. A wire Mbias and a via Vbias are connected to a photodiode PD. A bias voltage is applied to the photodiode PD via the wire Mbias and the via Vbias. Thus, the charges photoelectrically converted in the photodiode PD are easily taken into the impurity layer 52 and quickly transferred to the floating diffusion regions FD1 and FD2 via the transfer transistors TRG1 and TRG2. That is, according to the present embodiment, it is possible to increase the transfer rate of charges from the photodiode PD to the floating diffusion regions FD1 and FD2.

Eleventh Embodiment

Figure 18:
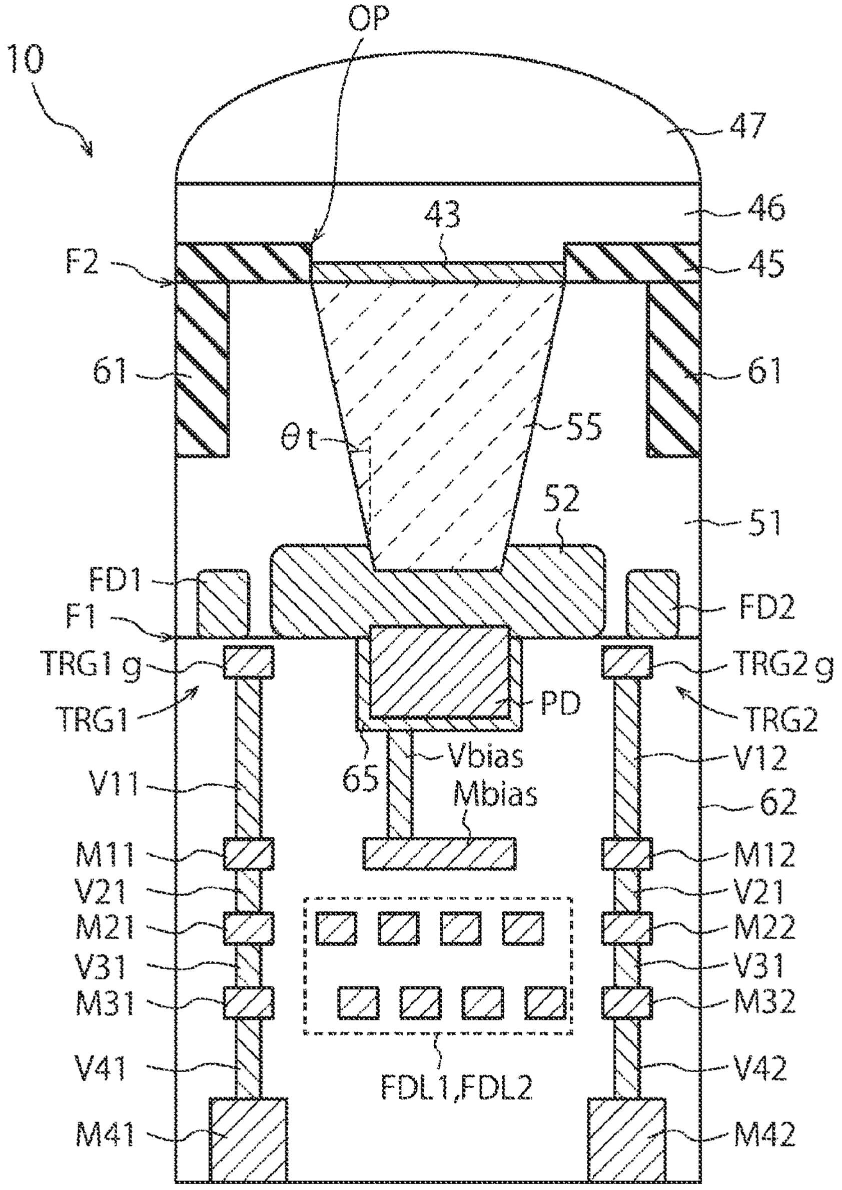
FIG. 18 is a cross-sectional view depicting a configuration example of a pixel according to an eleventh embodiment.

FIG. 18 is a cross-sectional view depicting a configuration example of a pixel 10 according to the eleventh embodiment. According to the eleventh embodiment, a photodiode PD is smaller in area than an opening OP and an impurity layer 52 when viewed from above a back surface F2 of a semiconductor layer 51. With this configuration, the contact area between the photodiode PD and the semiconductor layer 51 is reduced, and a dark current can be reduced.

In addition, the pixel 10 according to the eleventh embodiment further includes a metal layer 65. For the metal layer 65, a conductive metal material that reflects light is used, and for example, a metal material such as tungsten (W), aluminum (Al), or copper (Cu) is used. The metal layer 65 covers the periphery of a photodiode PD except for a contact portion between the photodiode PD and a semiconductor layer 51. That is, the metal layer 65 covers the bottom surface and the four side surfaces other than the top surface of the photodiode PD, and has a shape like a rectangular container. Furthermore, the metal layer 65 is provided between the photodiode PD and a via Vbias or a wire Mbias, and also functions as an electrode that electrically connects the photodiode PD and the wire Mbias.

The metal layer 65 reflects light incident on the photodiode PD in the photodiode PD to increase an optical path in the photodiode PD as much as possible. With this configuration, the quantum efficiency in the photodiode PD can be increased. That is, the metal layer 65 has a light confinement effect in the photodiode PD, and can increase quantum efficiency (sensitivity). In this case, even if the area of the planar layout of the photodiode PD is small, sufficiently high quantum efficiency can be obtained.

The metal layer 65 also functions as an electrode of the photodiode PD. Therefore, the bias voltage from the wire Mbias is applied to the photodiode PD from the entire bottom surface and side surfaces of the photodiode PD via the metal layer 65. Thus, the charges in the photodiode PD are more easily taken into the impurity layer 52, and the charge transfer rate is further increased.

The other configurations of the second embodiment may be similar to the corresponding configurations of the first embodiment. Therefore, the second embodiment further has the configuration of the first embodiment.

At least two of the first to eleventh embodiments described above may be combined with each other. For example, the metal layer 56 in the second embodiment may be applied to any of the third to eleventh embodiments. The metal layer 56 may be provided in either or both of the waveguides 55 and 155 in FIG. 11. Further, for example, the first and second impurity layers 52 in the ninth embodiment may be applied to any one of the first to eighth, tenth, and eleventh embodiments.

Next, a specific example of a planar layout of the pixel 10 according to the present disclosure will be described.

Figure 19:
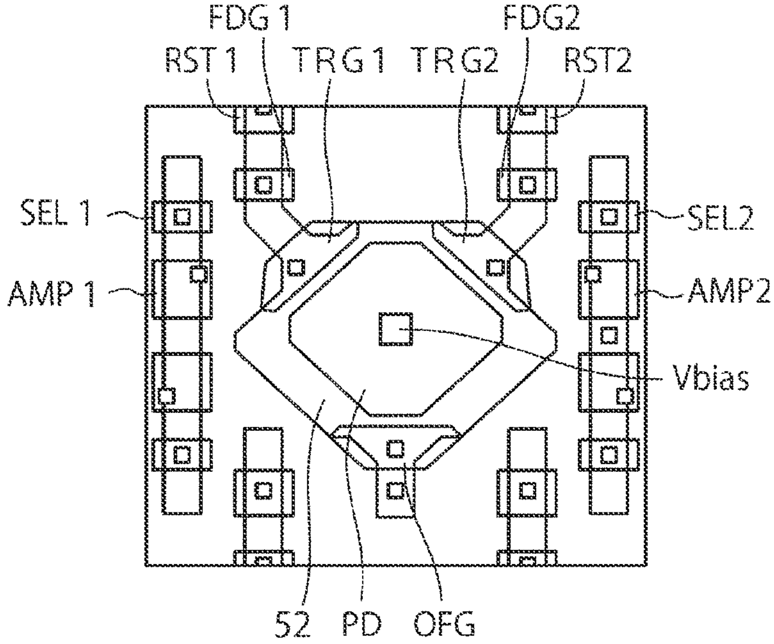
FIG. 19 is a plan view depicting an example of a pixel layout according to the present disclosure.

FIG. 19 is a plan view depicting an example of a layout of the pixel 10 according to the present disclosure. In FIG. 19, one photodiode PD is provided at the center of the impurity layer 52. A via Vbias is provided at the center of the photodiode PD.

Figure 20:
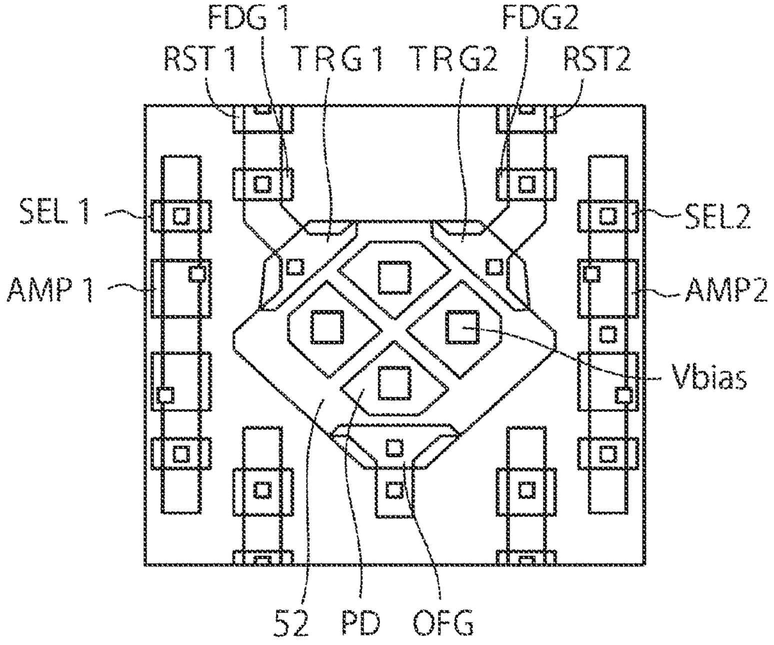
FIG. 20 is a plan view depicting another example of the pixel layout according to the present disclosure.

FIG. 20 is a plan view depicting another example of the layout of the pixel 10 according to the present disclosure. In FIG. 20, a plurality of photodiodes PD is provided at the center of the impurity layer 52. A via Vbias is provided at the center of each of the photodiodes PD. Therefore, the number of vias Vbias is the same as the number of the photodiodes PD. In FIG. 20, the photodiode PD is divided into four, but may be divided into three or less, or may be divided into five or more.

The width of the slit between the photodiodes PD is preferably narrower than the wavelength of the irradiation light. With this configuration, an effect of obtaining a resonance effect and promoting photoelectric conversion can be expected by optimizing the width of the slit with respect to the wavelength.

<Configuration Example of Electronic Device>

The ranging device 100 can be applied not only to a ranging device but also to various electronic devices including an imaging device such as a digital still camera or a digital video camera having a ranging function, and a smartphone having a ranging function.

Figure 21:
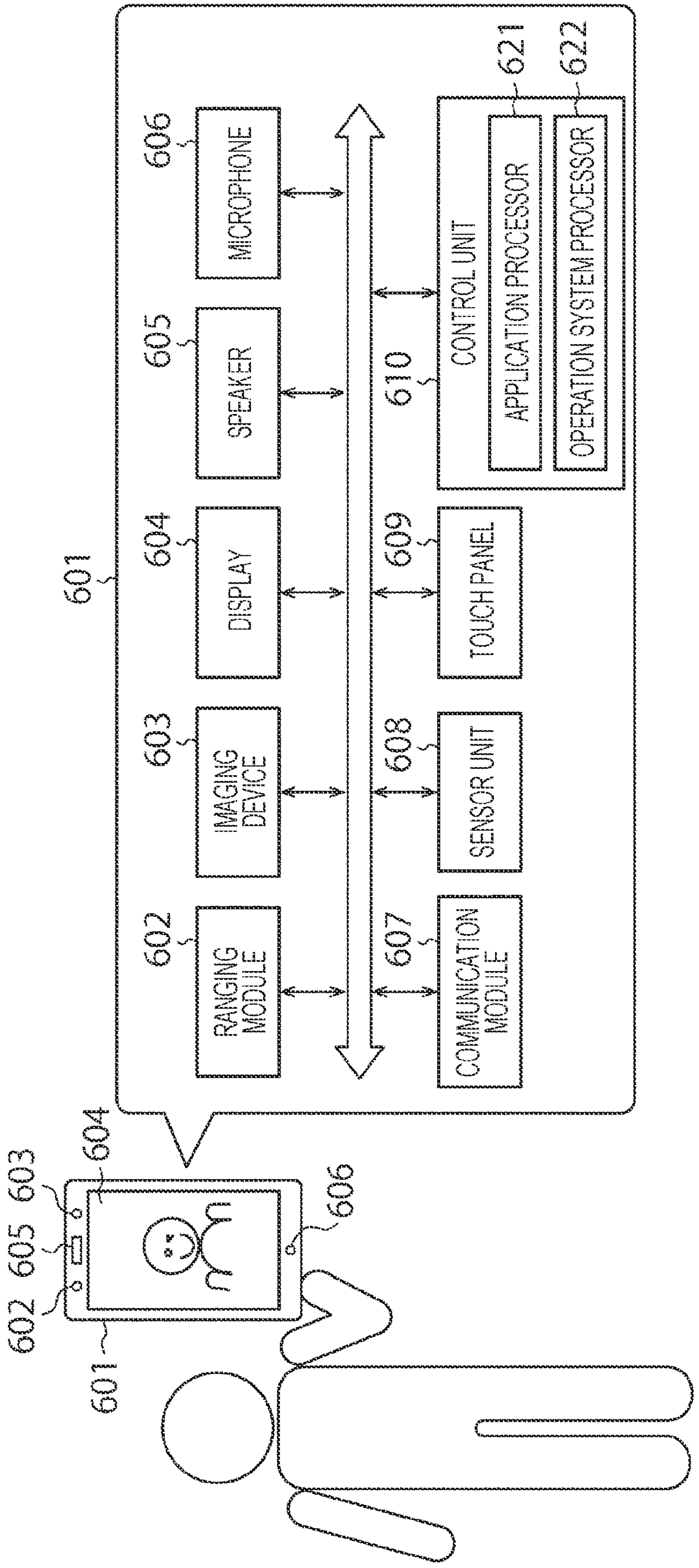
FIG. 21 is a block diagram depicting a configuration example of a smartphone serving as an electronic device to which the present technology is applied.

FIG. 21 is a block diagram depicting a configuration example of a smartphone serving as an electronic device to which the present technology is applied.

As illustrated in FIG. 21, a smartphone 601 includes a ranging module 602, an imaging device 603, a display 604, a speaker 605, a microphone 606, a communication module 607, a sensor unit 608, a touch panel 609, and a control unit 610 which are connected via a bus 611. In addition, the control unit 610 has functions as an application processor 621 and an operation system processor 622 by a CPU executing a program.

The ranging device 100 can be applied to the ranging module 602. For example, the ranging module 602 is disposed on the front surface of the smartphone 601, and performs distance measurement for the user of the smartphone 601, so that the depth value of the surface shape of the face, hand, finger, or the like of the user can be output as the ranging result.

The imaging device 603 is disposed on the front surface of the smartphone 601, and performs image capture with the user of the smartphone 601 as a subject to acquire an image including the user. Note that, although not illustrated, the imaging device 603 may also be disposed on the back surface of the smartphone 601.

The display 604 displays an operation screen for performing processing by the application processor 621 and the operation system processor 622, an image captured by the imaging device 603, and the like. The speaker 605 and the microphone 606 output the voice of the other party and collect the voice of the user, during, for example, a call using the smartphone 601.

The communication module 607 performs network communication via a communication network such as the Internet, a public telephone line network, a wide area communication network for a wireless mobile body such as a so-called 4G line or a 5G line, a wide area network (WAN), or a local area network (LA)), a short-range wireless communication such as Bluetooth (registered trademark) or near field communication (NFC), or the like. The sensor unit 608 senses speed, acceleration, proximity, and the like, and the touch panel 609 acquires a touch operation performed by the user on the operation screen displayed on the display 604.

The application processor 621 performs processing for providing various services by the smartphone 601. For example, the application processor 621 can perform processing of creating a face by computer graphics virtually reproducing the expression of the user on the basis of the depth value supplied from the ranging module 602 and displaying the created face on the display 604. Furthermore, the application processor 621 can perform processing of creating three-dimensional shape data of any three-dimensional object on the basis of the depth value supplied from the ranging module 602, for example.

The operation system processor 622 performs processing for achieving basic functions and operations of the smartphone 601. For example, the operation system processor 622 can perform processing of authenticating the user's face and unlocking the smartphone 601 on the basis of the depth value supplied from the ranging module 602. Furthermore, on the basis of the depth value supplied from the ranging module 602, the operation system processor 622 can perform, for example, processing of recognizing a gesture of the user and processing of inputting various operations according to the gesture.

The smartphone 601 configured as described above includes the ranging device 100 as the ranging module 602, thereby being capable of performing, for example, processing of measuring and displaying the distance to a predetermined object, processing of creating and displaying three-dimensional shape data of a predetermined object, and the like.

<Example of Application to Mobile Body>

The technology according to the present disclosure (present technology) can be applied to various products. For example, the technology according to the present disclosure may be implemented as a device to be mounted on any type of mobile bodies such as vehicles, electric vehicles, hybrid electric vehicles, motorcycles, bicycles, personal mobilities, airplanes, drones, ships, and robots.

Figure 22:
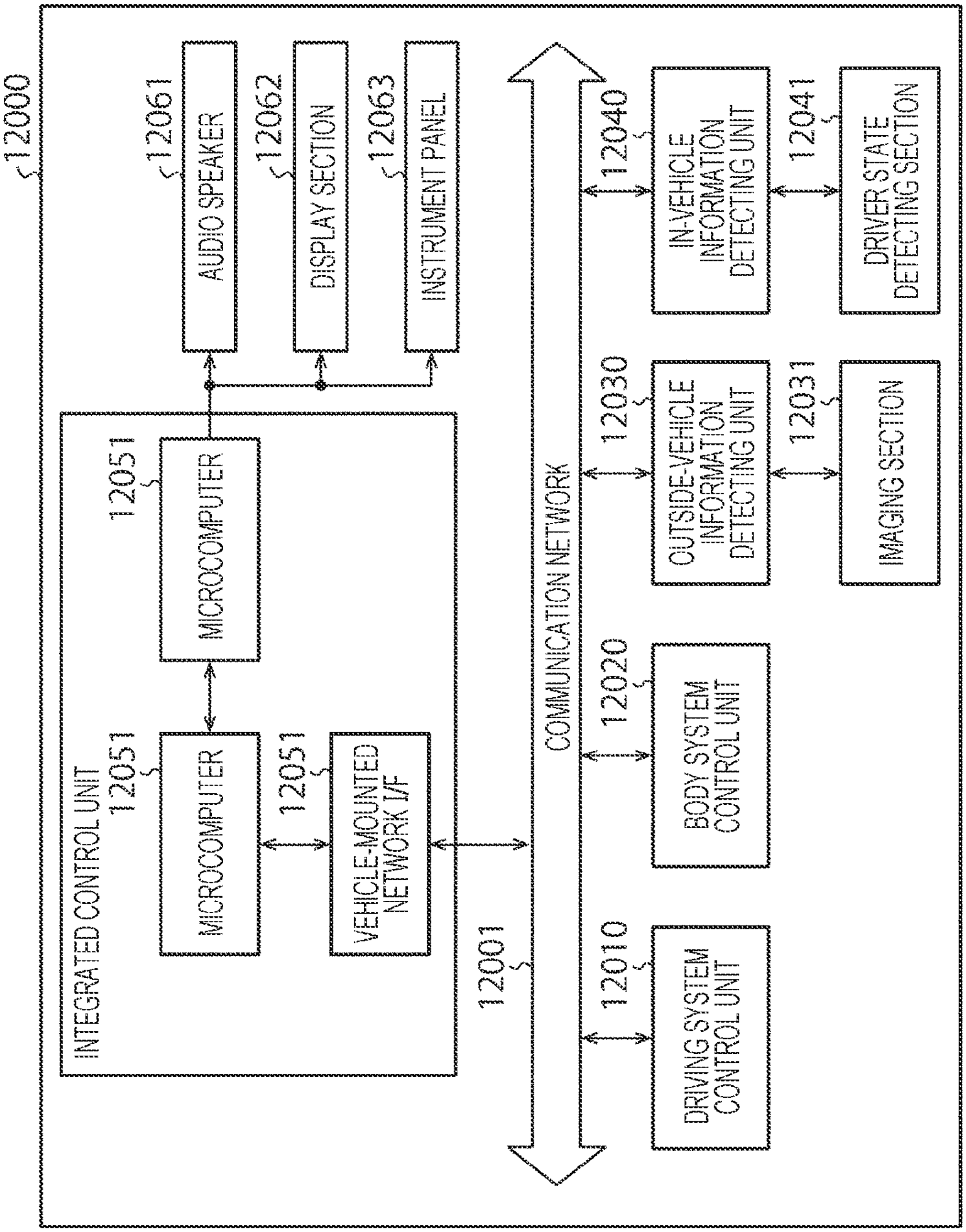
FIG. 22 is a block diagram depicting an example of schematic configuration of a vehicle control system as an example of a mobile body control system to which the technology according to an embodiment of the present disclosure can be applied.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. The outside-vehicle information detecting unit 12030 may include the ranging device 100 described above, and may perform processing of detecting an object such as a human, a vehicle, an obstacle, a sign, a character on a road surface, or the like, or processing of detecting a distance thereto on the basis of the received image.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

Figure 23:
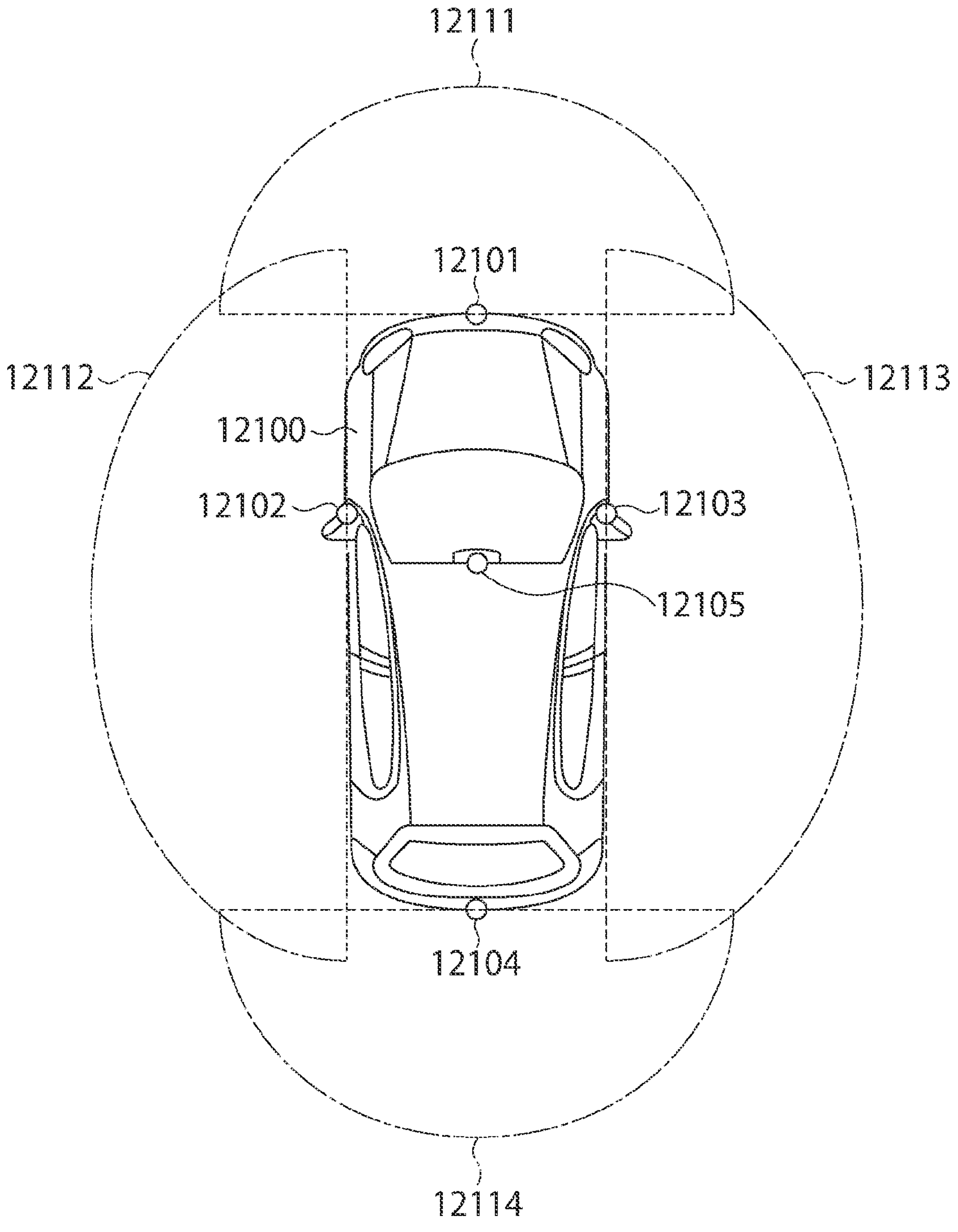
FIG. 23 is a diagram depicting an example of the installation position of an imaging section.

FIG. 23 is a diagram depicting an example of the installation position of the imaging section 12031.

In FIG. 23, a vehicle 12100 includes, as the imaging section 12031, imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the environment in front of the vehicle obtained by the imaging sections 12101 and 12105 are mainly used for detecting a preceding vehicle, a pedestrian, an obstacle, a traffic light, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

It should be noted that embodiments of the present technology are not limited to the abovementioned embodiments, and various modifications are possible without departing from the gist of the present technology. It is to be noted that the present technology may also have the following configurations.

(1)

A ranging device including:

a semiconductor layer having a first surface and a second surface opposite to the first surface;

a lens provided on a side of the second surface;

first and second charge storage sections provided in the semiconductor layer on a side of the first surface;

a photoelectric conversion section that is in contact with the semiconductor layer on the side of the first surface, the photoelectric conversion section including a material different from a material of the semiconductor layer;

first and second voltage application sections that apply a voltage to the semiconductor layer between the first and second charge storage sections and the photoelectric conversion section; and a waveguide provided in the semiconductor layer so as to extend from the second surface to the photoelectric conversion section, the waveguide including a material different from the material of the semiconductor layer.

(2)

The ranging device according to (1), in which an area of an end surface of the waveguide on the side of the first surface is smaller than an area of an end surface of the waveguide on the side of the second surface.

(3)

The ranging device according to (1) or (2), in which the waveguide: has an area equal to or larger than an area of an opening through which incident light passes from the lens to the semiconductor layer at an end surface on the side of the second surface; has an area equal to or smaller than an area of the photoelectric conversion section at an end surface on the side of the first surface; and has a side surface inclined in a direction perpendicular to the first surface or the second surface between the first surface and the second surface.

(4)

The ranging device according to any one of (1) to (3), in which the waveguide has a refractive index higher than a refractive index of the semiconductor layer.

(5)

The ranging device according to (4), in which the refractive index of the waveguide is lower than a refractive index of the lens.

(6)

The ranging device according to any one of (1) to (5), further including a metal layer provided on a side surface of the waveguide.

(7)

The ranging device according to any one of (1) to (6), in which silicon is used for the semiconductor layer, germanium, InGaAs, copper indium gallium diselenide (CIGS), or quantum dot (Qdot) is used for the photoelectric conversion section, and a resin material is used for the waveguide.

(8)

The ranging device according to any one of (1) to (7), further including a mixture layer provided between the photoelectric conversion section and the semiconductor layer, the mixture layer being obtained by mixing a material of the photoelectric conversion section and a material of the semiconductor layer.

(9)

The ranging device according to (1), further including an additional waveguide provided on the waveguide on the side of the second surface, in which an area of a first end surface of the waveguide on the side of the first surface is greater than an area of a second end surface of the waveguide on the side of the second surface, and an area of a third end surface of the additional waveguide facing the second end surface of the waveguide is smaller than an area of a fourth end surface of the additional waveguide on a side opposite to the third end surface.

(10)

The ranging device according to any one of (1) to (9), in which the first voltage application section includes a first gate electrode that is provided on the first surface between the first charge storage section and the photoelectric conversion section and that is insulated from the semiconductor layer, and the second voltage application section includes a second gate electrode that is provided on the first surface between the second charge storage section and the photoelectric conversion section and that is insulated from the semiconductor layer, the ranging device further including:

a second wire provided on the side of the first surface and connected to the first voltage application section; and a third wire provided on the side of the first surface and connected to the second voltage application section.

(11)

The ranging device according to (10), in which the first and second voltage application sections are provided on the first surface of the semiconductor layer with an insulating film interposed between the first and second voltage application sections and the first surface.

(12)

The ranging device according to (10), in which the first and second voltage application sections are embedded in the semiconductor layer from the first surface of the semiconductor layer.

(13)

The ranging device according to any one of (1) to (9), in which the first voltage application section includes a first impurity layer adjacent to the first charge storage section on the first surface and having a conductivity type different from a conductivity type of the first charge storage section, and the second voltage application section includes a second impurity layer adjacent to the second charge storage section on the first surface and having a conductivity type different from a conductivity type of the second charge storage section, the ranging device further including:

a second wire provided on the side of the first surface and connected to the first voltage application section; and a third wire provided on the side of the first surface and connected to the second voltage application section.

(14)

The ranging device according to any one of (1) to (13), in which the photoelectric conversion section is smaller than an opening through which incident light passes from the lens to the semiconductor layer when viewed from above the second surface of the semiconductor layer.

(15)

The ranging device according to any one of (1) to (14), further including a metal layer including a conductive material that reflects light, the metal layer covering a periphery of the photoelectric conversion section except for a contact portion between the photoelectric conversion section and the semiconductor layer.

It should be noted that the present disclosure is not limited to the abovementioned embodiments, and various modifications are possible without departing from the gist of the present disclosure. In addition, the effects described in the present specification are merely illustrative and not restrictive, and may have additional effects.

REFERENCE SIGNS LIST

100 Ranging device
1 Light receiving element
10 Pixel
PD Photodiode
TRG1, TRG2 Transfer transistor
FD1, FD2 Floating diffusion region
FDL1, FDL2 Additional capacitor
51 Semiconductor layer
47 On-chip lens
43 Antireflection film
45 Light shielding film
61 Inter-pixel isolation section
52 Impurity layer
V1 to V4, Vbias Via
M1 to M4, Mbias Wire
65 Metal layer
55 Waveguide

What is claimed is:

1. A ranging device, comprising:

a semiconductor layer having a first surface and a second surface opposite to the first surface;

a lens provided on a side of the second surface of the semiconductor layer;

first and second charge storage sections provided in the semiconductor layer on a side of the first surface of the semiconductor layer;

a photoelectric conversion section that is in contact with the semiconductor layer on the side of the first surface of the semiconductor layer, wherein the photoelectric conversion section includes a material different from a material of the semiconductor layer, and wherein the photoelectric conversion section protrudes past a plane of the first surface of the semiconductor layer;

first and second voltage application sections that apply a voltage to the semiconductor layer between the first and second charge storage sections and the photoelectric conversion section; and a waveguide provided in the semiconductor layer so as to extend from the second surface of the semiconductor layer to the photoelectric conversion section, the waveguide including a material different from the material of the semiconductor layer.

2. The ranging device according to claim 1, wherein an area of an end surface of the waveguide on the side of the first surface is smaller than an area of an end surface of the waveguide on the side of the second surface.

3. The ranging device according to claim 1, wherein the waveguide: has an area equal to or larger than an area of an opening through which incident light passes from the lens to the semiconductor layer at an end surface on the side of the second surface; has an area equal to or smaller than an area of the photoelectric conversion section at an end surface on the side of the first surface; and has a side surface inclined in a direction perpendicular to the first surface or the second surface between the first surface and the second surface.

4. The ranging device according to claim 1, wherein the waveguide has a refractive index higher than a refractive index of the semiconductor layer.

5. The ranging device according to claim 4, wherein the refractive index of the waveguide is lower than a refractive index of the lens.

6. The ranging device according to claim 1, further comprising a metal layer provided on a side surface of the waveguide.

7. The ranging device according to claim 1, wherein silicon is used for the semiconductor layer, germanium, InGaAs, copper indium gallium diselenide (CIGS), or quantum dot (Qdot) is used for the photoelectric conversion section, and a resin material is used for the waveguide.

8. The ranging device according to claim 1, further comprising a mixture layer provided between the photoelectric conversion section and the semiconductor layer, the mixture layer being obtained by mixing a material of the photoelectric conversion section and a material of the semiconductor layer.

9. A ranging device, comprising:

a semiconductor layer having a first surface and a second surface opposite to the first surface;

a lens provided on a side of the second surface of the semiconductor layer;

first and second charge storage sections provided in the semiconductor layer on a side of the first surface of the semiconductor layer;

a photoelectric conversion section that is in contact with the semiconductor layer on the side of the first surface of the semiconductor layer, the photoelectric conversion section including a material different from a material of the semiconductor layer;

first and second voltage application sections that apply a voltage to the semiconductor layer between the first and second charge storage sections and the photoelectric conversion section;

a first waveguide provided in the semiconductor layer so as to extend from the second surface of the semiconductor layer to the photoelectric conversion section, the first waveguide including a material different from the material of the semiconductor layer; and a second waveguide provided on the first waveguide on the side of the second surface of the semiconductor layer, wherein an area of a first end surface of the first waveguide on the side of the first surface of the semiconductor layer is greater than an area of a second end surface of the first waveguide on the side of the second surface of the semiconductor layer, and wherein an area of a third end surface of the second waveguide facing the second end surface of the first waveguide is smaller than an area of a fourth end surface of the second waveguide on a side opposite to the third end surface.

10. A ranging device, comprising:

a semiconductor layer having a first surface and a second surface opposite to the first surface;

a lens provided on a side of the second surface of the semiconductor layer;

first and second charge storage sections provided in the semiconductor layer on a side of the first surface of the semiconductor layer;

a photoelectric conversion section that is in contact with the semiconductor layer on the side of the first surface of the semiconductor layer, the photoelectric conversion section including a material different from a material of the semiconductor layer;

first and second voltage application sections that apply a voltage to the semiconductor layer between the first and second charge storage sections and the photoelectric conversion section;

a waveguide provided in the semiconductor layer so as to extend from the second surface of the semiconductor layer to the photoelectric conversion section, the waveguide including a material different from the material of the semiconductor layer, wherein the first voltage application section includes a first gate electrode that is provided on the first surface of the semiconductor layer between the first charge storage section and the photoelectric conversion section and that is insulated from the semiconductor layer, and wherein the second voltage application section includes a second gate electrode that is provided on the first surface of the semiconductor layer between the second charge storage section and the photoelectric conversion section and that is insulated from the semiconductor layer;

a second wire provided on the side of the first surface of the semiconductor layer and connected to the first voltage application section; and a third wire provided on the side of the first surface of the semiconductor layer and connected to the second voltage application section.

11. The ranging device according to claim 10, wherein the first and second voltage application sections are provided on the first surface of the semiconductor layer with an insulating film interposed between the first and second voltage application sections and the first surface.

12. The ranging device according to claim 10, wherein the first and second voltage application sections are embedded in the semiconductor layer from the first surface of the semiconductor layer.

13. The ranging device according to claim 1, wherein the first voltage application section includes a first impurity layer adjacent to the first charge storage section on the first surface and having a conductivity type different from a conductivity type of the first charge storage section, and the second voltage application section includes a second impurity layer adjacent to the second charge storage section on the first surface and having a conductivity type different from a conductivity type of the second charge storage section, the ranging device further comprising:

a second wire provided on the side of the first surface of the semiconductor layer and connected to the first voltage application section; and a third wire provided on the side of the first surface of the semiconductor layer and connected to the second voltage application section.

14. The ranging device according to claim 1, wherein the photoelectric conversion section is smaller than an opening through which incident light passes from the lens to the semiconductor layer when viewed from above the second surface of the semiconductor layer.

15. The ranging device according to claim 1, further comprising a metal layer including a conductive material that reflects light, the metal layer covering a periphery of the photoelectric conversion section except for a contact portion between the photoelectric conversion section and the semiconductor layer.

16. The ranging device according to claim 1, wherein the photoelectric conversion section protrudes into the semiconductor layer.

17. The ranging device according to claim 1, further comprising:

an impurity layer on a side of the first surface of the semiconductor layer, wherein the photoelectric conversion section protrudes into the impurity layer.

18. The ranging device according to claim 17, wherein the waveguide protrudes into the impurity layer.

19. The ranging device according to claim 1, wherein the waveguide is disposed between the first surface of the semiconductor layer and the second surface of the semiconductor layer.

20. The ranging device according to claim 1, wherein the first and second voltage application sections are disposed on first surface side of the semiconductor layer.

* * * * *